(12) United States Patent
Honda et al.

(10) Patent No.: US 7,764,552 B2
(45) Date of Patent: Jul. 27, 2010

(54) SEMICONDUCTOR INTEGRATED CIRCUIT

(75) Inventors: Takeshi Honda, Tokyo (JP); Noboru Sakimura, Tokyo (JP); Tadahiko Sugibayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 252 days.

(21) Appl. No.: 12/085,158

(22) PCT Filed: Nov. 7, 2006

(86) PCT No.: PCT/JP2006/322185

§ 371 (c)(1),
(2), (4) Date: May 16, 2008

(87) PCT Pub. No.: WO2007/058088

PCT Pub. Date: May 24, 2007

(65) Prior Publication Data

US 2010/0067292 A1    Mar. 18, 2010

(30) Foreign Application Priority Data

Nov. 17, 2005   (JP)   ............... 2005-332391

(51) Int. Cl.
*G11C 5/14*   (2006.01)
(52) U.S. Cl. .................. 365/189.09; 365/230.06; 365/158
(58) Field of Classification Search ............ 365/189.09, 365/230.06, 158
See application file for complete search history.

(56) References Cited

U.S. PATENT DOCUMENTS 4,276,615 A * 6/1981 Kuhnel .................. 365/45

| | | | |
|---|---|---|---|
| 2003/0007296 A1 | 1/2003 | Tomishima et al. |
| 2004/0165472 A1 | 8/2004 | Yamazaki |
| 2004/0232974 A1 | 11/2004 | Tobita |
| 2006/0028266 A1 | 2/2006 | Tobita |

FOREIGN PATENT DOCUMENTS

| | | |
|---|---|---|
| JP | 2002-111470 | 4/2002 |
| JP | 2002-208275 | 7/2002 |
| JP | 2003-22697 | 1/2003 |
| JP | 2004-220759 | 8/2004 |
| JP | 2004-234816 | 8/2004 |
| JP | 2004-259318 | 9/2004 |
| JP | 2005-6489 | 1/2005 |

OTHER PUBLICATIONS

Takeshi Honda, et al., MRAM-Writing Circuitry to Compensate for Thermal-Variation of Magnetization-Reversal Current, 2002 Symposium on VLSI Circuits Digest of Technical Papers, 2002, Fig. 4.

* cited by examiner

*Primary Examiner*—Huan Hoang
(74) *Attorney, Agent, or Firm*—McGinn IP Law Group, PLLC

(57) ABSTRACT

A semiconductor integrated circuit is provided that can prevent an internal voltage from the voltage generating circuit from varying during a long term. The semiconductor integrated circuit of the present invention includes a voltage generating circuit configured to generate a reference voltage; a function circuit configured to operate by using the reference voltage; a first capacitance connected to a first node between the voltage generating circuit and the function circuit; and a switch provided between the voltage generating circuit and the first node. The switch is in a turned-off state at least for a period during which the function circuit is in an activated state.

20 Claims, 24 Drawing Sheets

SEMICONDUCTOR INTEGRATED CIRCUIT

TECHNICAL FIELD

The present invention relates to a semiconductor integrated circuit. More particularly, the present invention relates to a semiconductor integrated circuit that contains a voltage generating circuit for generating an internal voltage.

BACKGROUND ART

Generally, in a semiconductor integrated circuit, desirable voltages other than power supply voltages are internally generated by a voltage generating circuit. The generated internal voltages are used in analog circuits such as a current source, a sense amplifier, and a different voltage generating circuit. In order to minimize a variation of the voltage generated by the voltage generating circuit, the output of the voltage generating circuit is typically connected to one end of a stabilization capacitance.

Such a configuration is described in Japanese Patent Application Publications (JP-P2002-111470A, JP-P2003-22697A, JP-P2005-6489A, JP-P2004-220759A, JP-P2002-208275A, and JP-P2004-259318A).

In the Japanese Patent Application Publication (JP-P2002-111470A), a semiconductor chip includes a plurality of circuit blocks whose operational power supply voltages are different from each other and whose logic threshold voltages are substantially common. In the circuit block, a potential difference between a low potential level and a high potential level is used as the operational power supply voltage, and the logic threshold voltage is put between them. Then, a signal of amplitude corresponding to the operational power supply voltage can be outputted, and a signal of different amplitude in which the logic threshold voltage is put between them can be inputted.

In the Japanese Patent Application Publication (JP-P2003-22697A), a load circuit performs an operation in response to an activation of a control signal. An internal power supply node is connected to the load circuit. An external power supply node supplies an external power supply voltage. An internal power supply voltage generator converts the external power supply voltage into an internal power supply voltage and supplies to the internal power supply node. An excessively charging preventing section prevents the excessive charging to the internal power supply node.

In the Japanese Patent Application Publication (JP-P2005-6489A), a first transistor of a first conductive type is connected between a reference voltage node to which a predetermined voltage is applied and a first internal node, and its control electrode is connected to a second internal node. A second transistor of the first conductive type is connected between the reference voltage node and the second internal node, and its control electrode is connected to the first internal node. A first capacitance element is connected between a first input node for receiving a first control signal for pre-charging and the first internal node. A second capacitance element is connected between a second input node for receiving a second control signal for accumulating charges and the second internal node. A third transistor of a second conductive type is connected between the second internal node and an output node, and its control electrode is connected to a third internal node. A third capacitance element is connected between the third internal node and a third input node for receiving a third control signal for transferring the charges. A fourth transistor of the second conductive type is connected between the output node and the third internal node, and its control electrode is connected to the second internal node.

In the Japanese Patent Application Publication (JP-P2004-220759A), a semiconductor memory device includes a first magneto-resistance element and a second magneto-resistance element, which have tunnel magneto-resistance effects, respectively, and hold data opposite to each other; and at least one or more transfer gates. In a magnetic memory cell, those first and second magneto-resistance elements are provided in series between both ends, and at least one or more above transfer gates are connected in series to the first and second magneto-resistance elements. First and second bit lines are connected to both ends of the magnetic memory cell, respectively. A first word line for write is arranged in the magnetic memory cell. A third bit line for reading data is connected to the magnetic memory cell. A second word line for reading is connected to gate electrodes of at least one or more above transfer gates.

In the Japanese Patent Application Publication (JP-P2002-208275A), a semiconductor integrated circuit contains a function circuit and a power supply circuit for supplying at least one kind of a power supply voltage to the function circuit. Resistance elements are collectively arranged in the output unit of at least one kind of the power supply voltage, among the power supply voltages.

In the Japanese Patent Application Publication (JP-P2004-259318A), a synchronous semiconductor memory device operates as a static type memory in a pseudo manner. A plurality of dynamic type memory cells are arranged in a matrix. A signal input circuit latches an operational control signal from outside synchronously with a clock signal, and generates an internal operation instruction signal. A row selecting circuit selects a row of the memory cells in accordance with an external row address signal at a time of activation. A column circuit selects a column of the memory cells in accordance with an external column address signal at the time of activation and carries out a data access to the selected column. A control circuit sequentially activates and deactivates the row selecting circuit and the column circuit in a predetermined sequence in accordance with a first internal operation instruction signal from the signal input circuit. Also, the control circuit inhibits the deactivation of the row selecting circuit and keeps the row selecting circuit active, in accordance with a second internal operation instruction signal from the signal input circuit. Also, the control circuit further deactivates the row selecting circuit, which is kept active, in accordance with a third internal operation instruction signal from the signal input circuit.

For example, in FIG. 1A and FIG. 1B, a voltage generating circuit 101 supplies an internal voltage to a function circuit 102. A control signal generating circuit 105 outputs a signal for controlling the function circuit 102. One end of a stabilization capacitance 103 is connected to a node N1 between the voltage generating circuit 101 and the function circuit 102. Also, the other end of the stabilization capacitance 103 is connected to a terminal of a power supply voltage Vdd (FIG. 1A) or a terminal of a ground GND (FIG. 1B).

The thus-generated predetermined voltage is used as a reference voltage at a time of write or read in the semiconductor storage device. For example, in case of a magnetic random access memory (MRAM) (refer to Japanese Patent Application Publication (JP-P2004-220759A)) that has been noted from the viewpoint of a non-volatile property, a high speed operation, a large capacity and a low electric power consumption, the predetermined voltage generated by the voltage generating circuit is used to generate a write current and a read current. In particular, a high precision is required for the write current of the MRAM. Thus, the voltage variation is required to be minimized.

The voltage stabilizing technique in the semiconductor integrated circuit device (MRAM) of the related art will be further described below. Here, the explanation with regard to the generation of the write current is carried out, and the explanation with regard to the read current is omitted.

FIG. 2 is a block diagram showing the configuration of the related-art MRAM. This MRAM contains a memory cell array 110, an X-side constant current source circuit 120, an X-side selector 121, an X-side current termination circuit 122, a Y-side constant current source circuit 130, a Y-side selector 131, a Y-side current termination circuit 132 and a sense amplifier circuit 133. Moreover, the MRAM contains the voltage generating circuit 101, the stabilization capacitance 103 and the control signal generating circuit 105 that are shown in FIG. 1A. In this case, the X-side constant current source circuit 120 or the Y-side constant current source circuit 130 corresponds to the function circuit 102, and this operates in accordance with the voltage generated by the voltage generating circuit 101. The stabilization capacitance 103 is provided in parallel between the voltage generating circuit 101 and each of the current source circuits 120 and 130. The control signal generating circuit 105 supplies a decoder activation signal XDENW to the X-side selector 121 and the Y-side selector 131. Also, the control signal generating circuit 105 supplies a write signal WCSEN to the constant current source circuits 120 and 130. With regard to the voltage levels of the respective signals, the power supply voltage Vdd corresponds to a High level (H), and the ground GND corresponds to a Low level (L).

FIG. 3 is a circuit diagram showing a part of the configuration shown in FIG. 2 in detail. Here, for the purpose of simplification, the write circuit on the X-side will be mainly described.

The voltage generating circuit 101 generates an output voltage Vp1 (<the power supply voltage Vdd). The output of the voltage generating circuit 101 is connected through parasitic resistances r1 and r2, which are caused due to wirings, to the input of the X-side constant current source circuit 120 (hereinafter, to be referred to as a write current source). A voltage applied to the write current source 120 is assumed to be Vp2. Also, the stabilization capacitance 103 is connected to the node N1 between the voltage generating circuit 101 and the write current source 120. Its capacitance value Cp is variable depending on an application field, such as several 10 pF to several 10 nF. The stability of the voltage Vp2 is improved by this stabilization capacitance 103.

The write current source 120 has a Pch transistor (current source) MP and a switch MPS. The voltage Vp2 is applied to the gate of the Pch transistor MP. In short, the input voltage Vp2 to the write current source 120 is the gate voltage of the Pch transistor MP. When the voltage Vp2 is set such that the Pch transistor MP operates in a saturation region, the current source MP sends a write current $Iw=\frac{1}{2}\mu_p W/L(Vp2-Vtp)^2$ to a node NB. Here, $\mu_p$ is a mobility, W is a gate width, L is a gate length, and Vtp is a threshold voltage. The switch MPS is provided between the node NB and the output node NA of the write current source 120.

The output node NA in the write current source 120 is connected through the X-side selector 121 to the memory cell array 110. The X-side selector 121 activates one selection line in accordance with a logical product of the decoder activation signal XDENW and an address signal XAn. Also, when the write signal WCSEN becomes High, the switch MPS is turned on. Consequently, the write current Iw from the write current source 120 is supplied to a memory cell 111 or the vicinity thereof. The write signal WCSEN is a signal for activating the write current source 120.

In the circuit configuration shown in FIG. 3, when the input voltage Vp2 to the write current source 120 varies, the write current Iw from the write current source 120 is also largely varied. FIG. 4 shows the current variation caused when there is the voltage variation of several mV. This current variation is estimated through a SPICE simulation. From FIG. 4, it is known that the current variation of about 10% is caused by the voltage variation of 10 mV. In order to suppress such a voltage variation, the large size (the capacitance value Cp=several nF) is typically used as the stabilization capacitance 103.

The inventor of this application noted the following points. As mentioned above, by enlarging the size of the stabilization capacitance 103, it is possible to stabilize the voltage variation to some degree. However, because of the circuit operation, it is impossible to perfectly reduce the voltage variation to zero. Thus, even in case of the very small voltage variation such as about several µV, when the voltage variation is accumulated, there is a possibility that the circuit operation becomes unstable. In particular, in the MRAM, the voltage variation directly leads to the variation in the write current Iw. Therefore, the accumulated voltage variation causes erroneous write and reduces the reliability of a memory.

The accumulation of the voltage variation will be described below by referring to FIG. 3 and FIG. 5. FIG. 5 shows the decoder activation signal XDENW, the write signal WCSEN, the voltage VA of the output node NA, the voltage VB of the node NB, the gate voltage Vp2 of the Pch transistor MP (current source) and the current Ip flowing through the parasitic resistance r1. The respective signals are assumed such that the power supply voltage Vdd corresponds to the High level (H), and the ground GND corresponds to the Low level (L).

At a time of standby, namely, when the write signal WCSEN is Low, the gate voltage Vp2 of the Pch transistor MP is equal to the output voltage Vp1 (<the power supply voltage Vdd) of the voltage generating circuit 101. Also, at this time, the voltage VA is Low, and the voltage VB is High.

At a time t1, the write signal WCSEN becomes High, and the write current source 120 is activated. Then, the voltage VB of the node NB decreases sharply toward the Low level. Also, the gate voltage Vp2 decreases due to the coupling of a parasitic capacitance Cc of the current source MP. Since the gate voltage Vp2 becomes lower than the voltage level Vp1, the current Ip flows into the stabilization capacitance 103. Because of this flow-in charges, the gate voltage Vp2 is gradually increased. After the sufficient elapse of the time, the gate voltage Vp2 comes close to the voltage level Vp1.

At a time t2, the write signal WCSEN becomes Low, and the write current source 120 is deactivated. Then, the voltage of the node NB sharply returns to Vdd. Also, the gate voltage Vp2 is increased due to the coupling of the parasitic capacitance Cc. At this time, reversely, since the gate voltage Vp2 becomes higher than the voltage level Vp1, the current Ip flows out from the stabilization capacitance 103 to the voltage generating circuit 101. With the sufficient elapse of the time, the gate voltage Vp2 comes close to the voltage level Vp1.

However, as shown in FIG. 5, when a next write operation starts at a time t3 before the gate voltage Vp2 is perfectly returned to the voltage level Vp1, a problem is caused. That is, at the time t3, there is a difference between the gate voltage Vp2 and the voltage level Vp1. Thus, the write operation is carried out in the situation that the gate voltage Vp2 is beyond a design value. There is a possibility that the next write operation starts immediately after the completion of the write operation at a time t4. The repetition of such an operation results in the accumulation of the differences between the gate voltage Vp2 and the voltage level Vp1. That is, the great voltage variation is generated with regard to the gate voltage Vp2. In the case of the MRAM, the variation in the gate voltage Vp2 directly leads to the variation in the write current Iw. Thus, it becomes impossible to insure the stable write operation.

FIG. 6 shows a result of a SPICE simulation to explain the foregoing phenomenon. In FIG. 6, a longitudinal axis (Ip) shows a parasitic current that flows through the parasitic resistance r1 from the voltage generating circuit 101 to the stabilization capacitance 103. For the write period during which the write current source 120 is activated, a parasitic current Ip of about +90 μA flows. On the other hand, when the write current source 120 is deactivated, the parasitic current Ip of about 2 μA flows from the stabilization capacitance 103 to the voltage generating circuit 101. A sum of values Q(+) and Q(−) in which the respective currents Ip are temporally integrated is a charge amount accumulated in the stabilization capacitance 103. Thus, $$\Delta Vc=[Q(+)-Q(-)]/Cp$$

corresponds to the voltage variation in the voltage Vp2.

FIG. 7 shows the result of the SPICE simulation similarly to FIG. 6 and shows the variation in the voltage Vp2 when the write operation is carried out 1000 times at a speed of 100 MHz. The voltage level Vp1 is assumed to be 675 mV. Because of the coupling of the parasitic capacitance Cc, the voltage Vp2 varies by about 7 mV for each write operation. However, this variation is not a problem because this is equal every time. On the other hand, the level of the voltage Vp2 is known to vary by about 2 mV in the long term because of the foregoing accumulation effect. In short, the voltage variation of about 2 mV is generated from the time immediately after the start of the write to the time of the completion ($\Delta Vc \approx 2$ mV). As shown in FIG. 4, even in case of the voltage variation of several mV, there is a risk that the write current variation of several % is caused. This leads to an erroneous operation at the time of write and results in reduction in the reliability of the MRAM.

As mentioned above, the related-art semiconductor integrated circuit has the difficulty that the influence of the coupling of the parasitic capacitance causes the internal voltage from the voltage generating circuit 101 to be greatly varied in the long term. This leads to the erroneous operation of the function circuit 102 that operates in accordance with the internal voltage. Also, when the operation of the function circuit 102 is kept waiting until the internal voltage is stabilized (until Vp2=Vp1 in the foregoing example), the entire operation speed of the semiconductor integrated circuit is decreased. This acts as a factor that prevents the higher speed operation of the MRAM.

DISCLOSURE OF INVENTION

An object of the present invention is to provide a semiconductor integrated circuit that can prevent an internal voltage from the voltage generating circuit from varying during a long term.

Another object of the present invention is to provide a technique that can improve the reliability and operation speed of a semiconductor integrated circuit.

Still another object of the present invention is to provide an MRAM that has an excellent reliability and can attain a high speed operation.

A semiconductor integrated circuit of the present invention includes a voltage generating circuit configured to generate a reference voltage; a function circuit configured to operate by using the reference voltage; a first capacitance connected to a first node between the voltage generating circuit and the function circuit; and a switch provided between the voltage generating circuit and the first node. The switch is turned off at a time simultaneous with a first time at which the function circuit is activated, or at a time previous to the first time by a predetermined time. Also, the switch is turned on at a time simultaneous with a second time at which the function circuit is deactivated, or at a time after the second time by a predetermined time. That is, the switch is in a turned-off state at least for a period during which the function circuit is in an activated state.

Thus, it is possible to prevent the current from flowing between the voltage generating circuit and the first capacitance for the period during which the function circuit is activated. As a result, the above-mentioned accumulation phenomenon of the voltage variation is prevented. Thus, the long-term variation in the reference voltage that is supplied to the function circuit from the voltage generating circuit is prevented, thereby improving the reliability in the semiconductor integrated circuit. Also, the operation of the function circuit is not required to be kept waiting until the reference voltage is stabilized. Therefore, the operation speed of the semiconductor integrated circuit is improved. In this way, according to the present invention, the semiconductor integrated circuit that has the excellent reliability, yield and operation speed is provided.

The semiconductor integrated circuit according to the present invention may further contain a second capacitance connected to a second node between the voltage generating circuit and the switch.

The voltage generating circuit according to the present invention may generate a plurality of kinds of voltages as the reference voltages. In this case, the function circuit receives the plurality of reference voltages through a plurality of routes, and operates by using the plurality of reference voltages. The first capacitance is connected to the first node in each of the plurality of routes.

The function circuit may be a current source for generating a predetermined current based on the reference voltage. In this case, the semiconductor integrated circuit may further contain a memory cell array; and a decoder provided between the memory cell array and the current source. The decoder is activated in response to a decoder activation signal such that the predetermined current is supplied to the memory cell array. The switch operates in synchronization with the decoder activation signal. Specifically, the semiconductor integrated circuit further contains a control signal generating circuit configured to generate the decoder activation signal to the decoder and the switch. The switch is turned on or turned off in response to the decoder activation signal. The control signal generating circuit outputs an activation signal to the function circuit to activate the current source, after the generation of the decoder activation signal to turn off the switch, and outputs a deactivation signal to deactivate the current source, before the output of the decoder activation signal to turn on the switch.

The semiconductor integrated circuit according to the present invention may further contain a memory cell array; and a decoder provided between the memory cell array and the current source. The decoder is activated in response to a decoder activation signal such that the predetermined current is supplied to the memory cell array, and the switch operates in synchronization with a signal other than the decoder activation signal.

A memory element included in the memory cell array may be a magnetic tunnel junction element. In short, the semiconductor integrated circuit according to the present invention may be the MRAM. In case of the MRAM, the reference voltage is used to generate a write current. Thus, when the present invention is applied to the MRAM, the stable write current can be supplied to the memory cell array for the long term. This is suitable for the MRAM in which the high precision is required for the write current.

According to the semiconductor integrated circuit according to the present invention, it is possible to prevent the internal voltage from the voltage generating circuit from varying for the long-term. Thus, the reliability and operation speed of the semiconductor integrated circuit are improved. In particular, the MRAM that has the excellent reliability and can attain the high speed operation can be provided.

BEST MODE FOR CARRYING OUT THE INVENTION

Hereinafter, a semiconductor integrated circuit according to the present invention will be described in detail with reference to the attached drawings.

Figure 8:
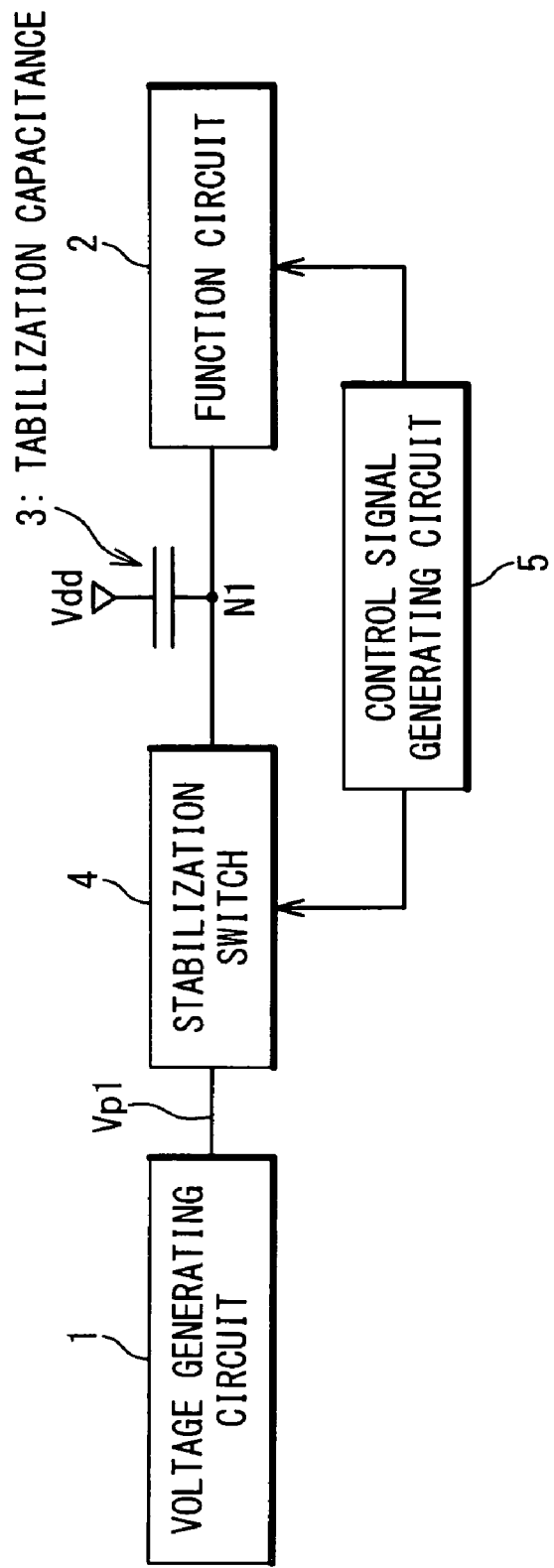
FIG. 8 is a block diagram showing a configuration of a semiconductor integrated circuit according to the present invention.

FIG. 8 schematically shows the configuration of the semiconductor integrated circuit according to the present invention. This semiconductor integrated circuit contains a voltage generating circuit 1, a function circuit 2, a stabilization capacitance 3, a stabilization switch 4 and a control signal generating circuit 5. The function circuit 2 operates in accordance with a voltage Vp1 generated by the voltage generating circuit 1. In that meaning, the voltage Vp1 generated by the voltage generating circuit 1 is referred to as "Internal Voltage" or "Reference Voltage". One end of the stabilization capacitance 3 is connected to a first node N1 between the voltage generating circuit 1 and the function circuit 2. The other end of the stabilization capacitance 3 is connected to a terminal of a power supply voltage Vdd or a terminal of a ground GND. The stabilization switch 4 is provided between the voltage generating circuit 1 and the first node N1.

The control signal generating circuit 5 generates a control signal for activating/deactivating the function circuit 2 to output to the circuit 2. Also, the control signal generating circuit 5 generates a switch control signal for turning on/turning off the stabilization switch 4 to output to the switch 4. The function circuit 2 is assumed to be activated at a first time and deactivated at a second time. At this time, according to the present invention, the stabilization switch 4 is turned off simultaneously with the first time or at a predetermined time previous to the first time. Also, the stabilization switch 4 is turned on simultaneously with the second time or at a predetermined time after the second time. That is, the stabilization switch 4 is turned off at least for a period during which the function circuit 2 is activated.

Thus, it can be prevented that current flows between the voltage generating circuit 1 and the stabilization capacitance 3, for the period during which the function circuit 2 is activated. As a result, the accumulation phenomenon of the voltage variation as mentioned above is prevented. Therefore, the long-term variation in the reference voltage supplied from the voltage generating circuit 1 to the function circuit 2 is prevented, so that the reliability of the semiconductor integrated circuit can be improved.

The present invention will be described below in further detail by exemplifying an MRAM as the semiconductor integrated circuit. In case of the MRAM, the magnetic tunnel junction (MTJ) element is used as the memory cell (storing element).

First Exemplary Embodiment

Figure 9:
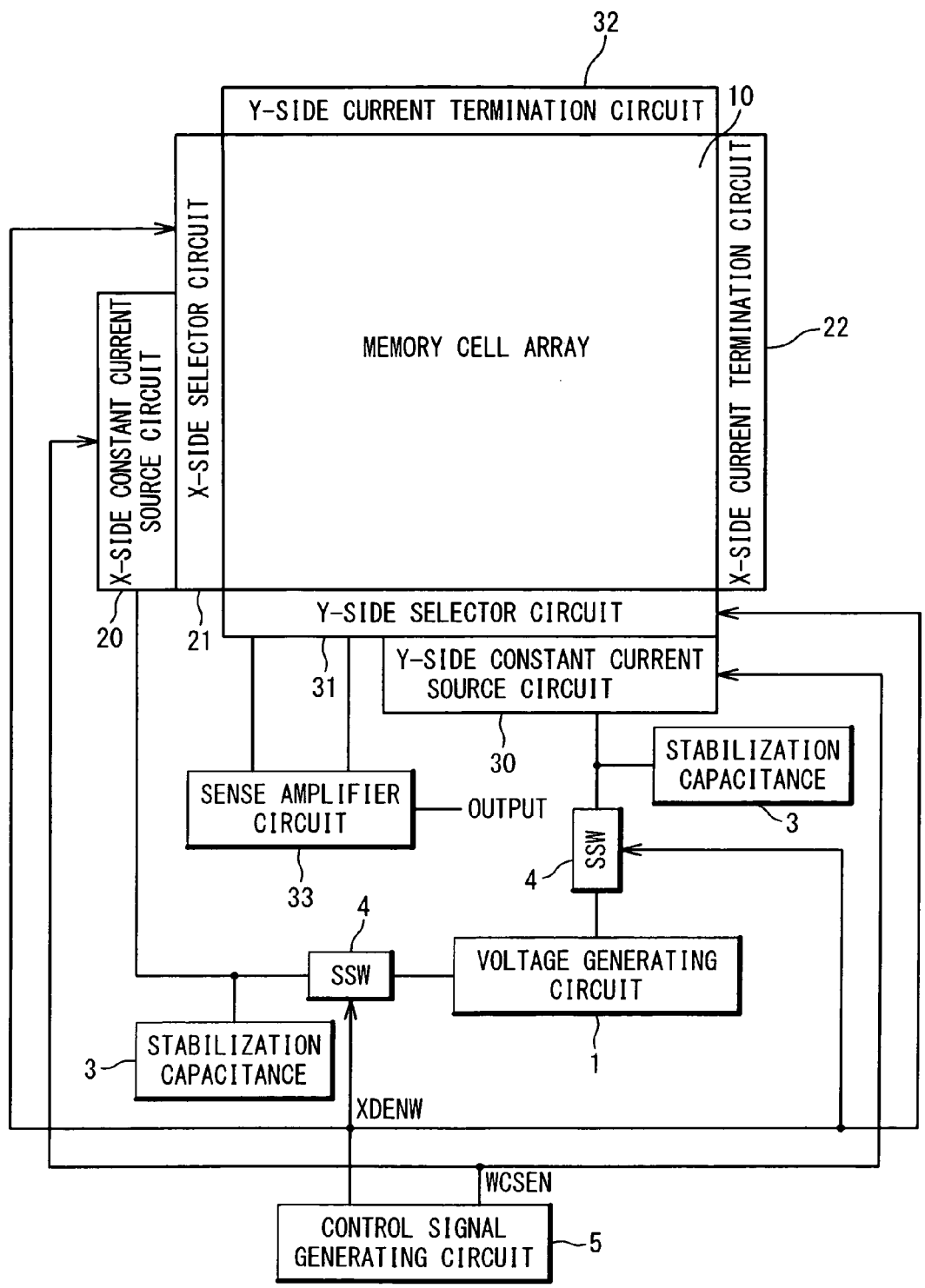
FIG. 9 is a block diagram showing a configuration of the semiconductor integrated circuit according to a first exemplary embodiment of the present invention.

FIG. 9 is a block diagram showing the configuration of the MRAM according to the first exemplary embodiment of the present invention. This MRAM contains a memory cell array 10, an X-side constant current source circuit 20, an X-side selector 21, an X-side current termination circuit 22, a Y-side constant current source circuit 30, a Y-side selector 31, a Y-side current termination circuit 32 and a sense amplifier circuit 33. Moreover, the MRAM contains the voltage generating circuit 1, the stabilization capacitances 3, the stabilization switches (SSW) 4 and the control signal generating circuit 5 that are shown in FIG. 8. In this case, the X-side constant current source circuit 20 or the Y-side constant current source circuit 30 corresponds to the function circuit 2, and this operates in accordance with the voltage generated by the voltage generating circuit 1. The stabilization capacitance 3 is inserted in parallel between the voltage generating circuit 1 and the current source circuits 20 and 30. The stabilization switch 4 is provided between the voltage generating circuit 1 and the stabilization capacitance 3.

The control signal generating circuit 5 supplies a decoder activation signal XDENW to the X-side selector (X-side decoder) 21 and the Y-side selector (Y-side decoder) 31. Also, the control signal generating circuit 5 supplies a write signal WCSEN to the current source circuits 20 and 30. With regard to the voltage levels of the respective signals, the power supply voltage Vdd corresponds to the High level (H), and the ground Gnd corresponds to the Low level (L).

Figure 10A:
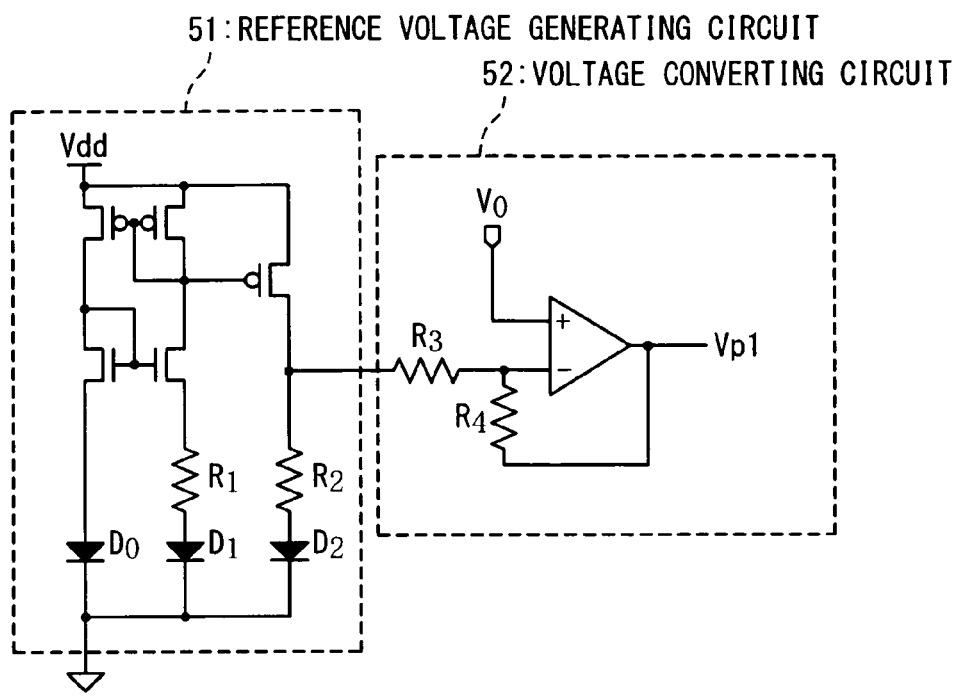
FIG. 10A is a circuit diagram showing one example of the configuration of a voltage generating circuit.

The voltage generating circuit 1 generates an output voltage Vp1 (<the power supply voltage Vdd). Specific configuration examples of the voltage generating circuit 1 are shown in FIG. 10A to FIG. 10D. The voltage generating circuit 1 contains a reference voltage generating circuit 51 and a voltage converting circuit 52. In FIG. 10A, the reference voltage generating circuit 51 contains diodes D0 to D2 and resistances R1 and R2. Also, the voltage converting circuit 52 includes resistances R3 and R4. A voltage $V_O$ is a constant voltage without any temperature dependence that is generated by a different voltage generating circuit. At this time, the output voltage Vp1 of the voltage generating circuit 1 is given by the following equation:

$$Vp1=(1+R4/R3)V_O-(R4/R3)(V_F+k_BT/q(R2/R1)\ln(N)).$$

Here, $V_F$ is a junction potential of the diode D2, and N is a junction area ratio of the diodes D0 and D1, $k_B$ is a Boltzmann constant, and q is a charge amount. The output voltage Vp1 is determined in accordance with the settings of the parameters R1 to R4, N and $V_O$.

Figure 10B:
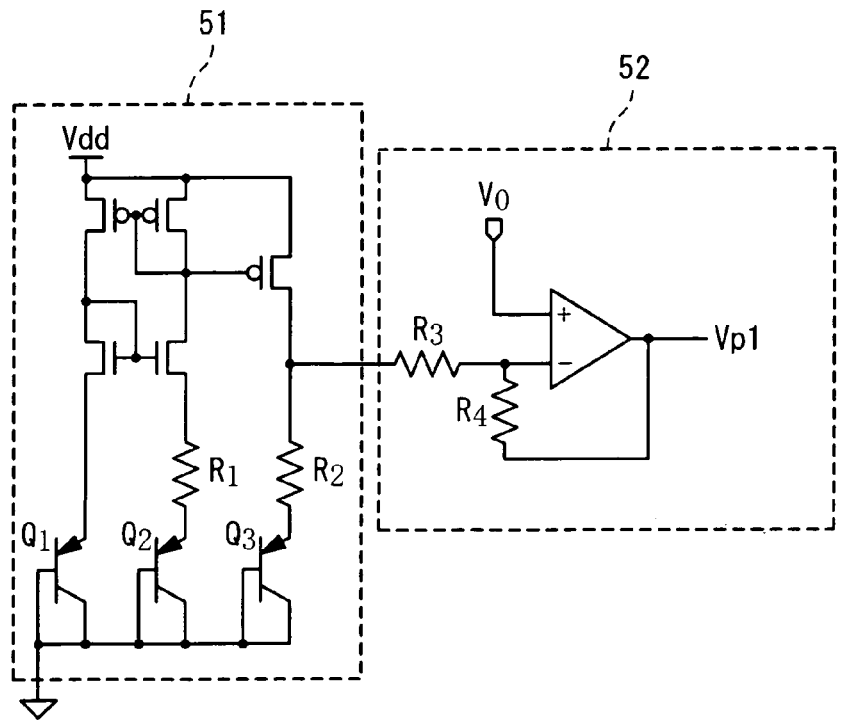
FIG. 10B is a circuit diagram showing another example of the configuration of the voltage generating circuit.
Figure 10C:
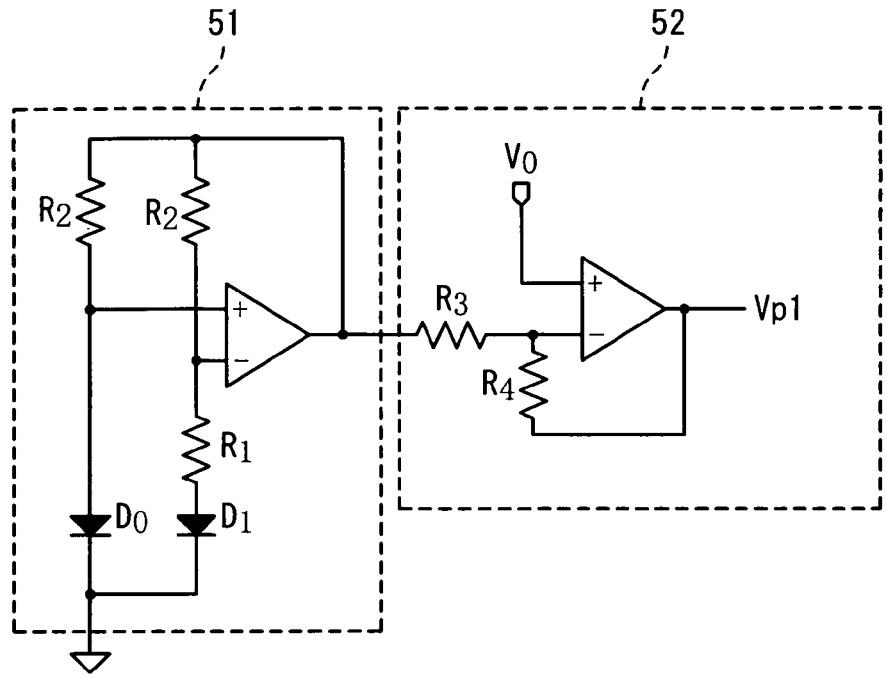
FIG. 10C is a circuit diagram showing still another example of the configuration of the voltage generating circuit.
Figure 10D:
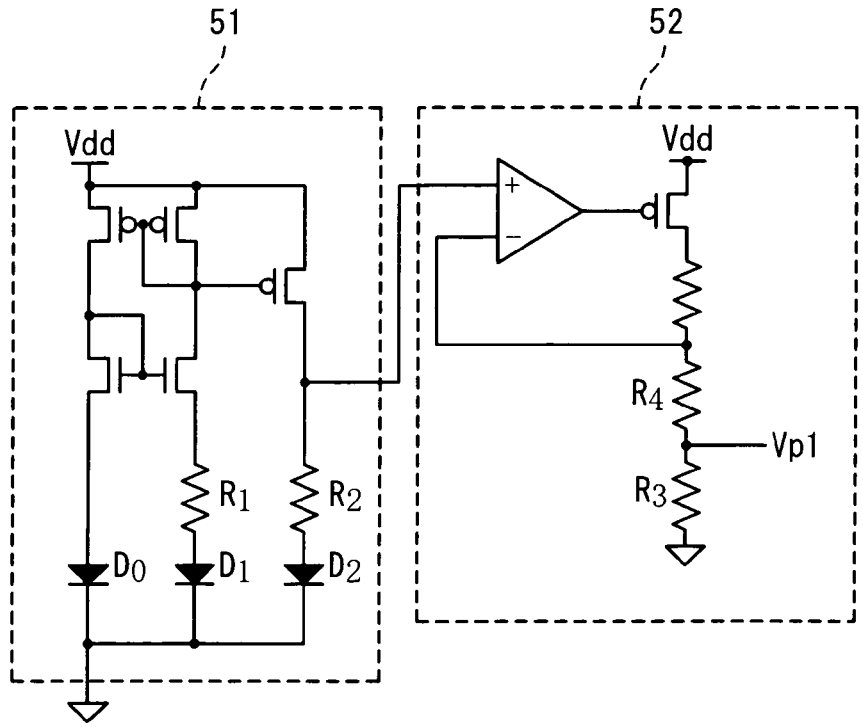
FIG. 10D is a circuit diagram showing still another example of the configuration of the voltage generating circuit.

In FIG. 10B showing another structure example, the diode is replaced by a PNP bipolar transistor. In FIG. 10C, the reference voltage generating circuit 51 of an amplifying type is used. In FIG. 10D, the voltage converting circuit 52 of a resistance division type is used. In FIG. 10D, the output voltage Vp1 is given by the following equation:

$$Vp1=1/(1+R4/R3)(V_F+k_BT/q(R2/R1)\ln(N)).$$

Figure 11:
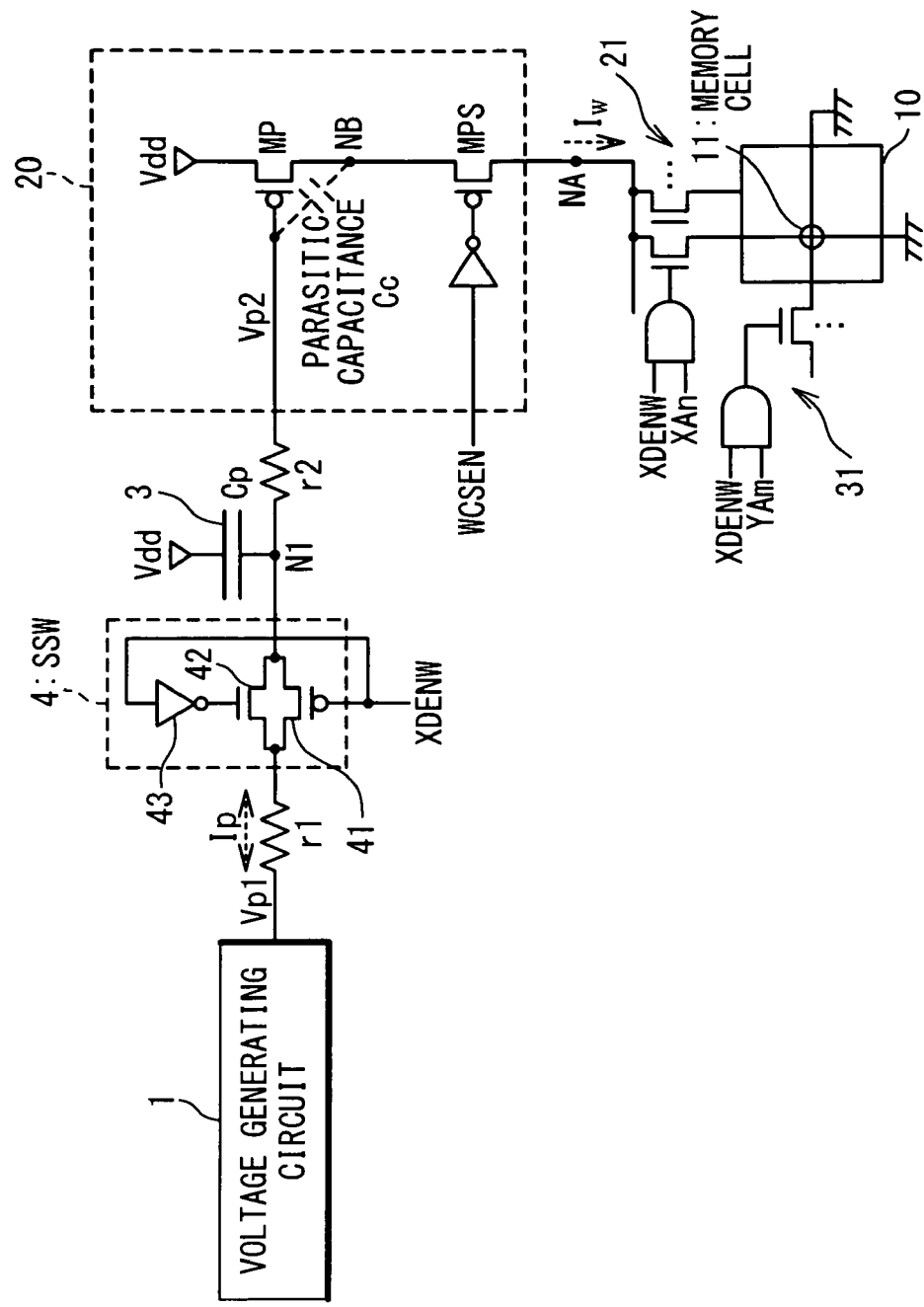
FIG. 11 is a circuit diagram showing a part of the configuration shown in FIG. 9.

FIG. 11 is a circuit diagram showing a part of the configuration shown in FIG. 9 in detail. Here, for the purpose of simplification, the X-side write circuit will be described.

The output of the voltage generating circuit 1 is connected to the input of the X-side constant current source circuit 20 (hereinafter, to be referred to as a write current source) through parasitic resistances r1 and r2 by the wirings, and the stabilization switch 4. The output voltage Vp1 (<the power supply voltage Vdd) generated by the voltage generating circuit 1 is supplied to the write current source 20. An input voltage supplied to the write current source 20 is assumed to be Vp2. Also, the stabilization capacitance 3 is connected to the node N1 between the voltage generating circuit 1 and the write current source 20. Its capacitance value Cp is different, depending on an application field, and are such as several 10 pF to several 10 nF. The stability of the voltage Vp2 is improved by this stabilization capacitance 103, and the voltage Vp2 is kept constant.

The write current source 20 has a Pch transistor (current source) MP and a switch MPS. The voltage Vp2 is applied to the gate of the Pch transistor MP. In short, the input voltage Vp2 to the write current source 20 is the gate voltage of the Pch transistor MP. When the voltage Vp2 is set such that the Pch transistor MP operates in a saturation region, the current source MP sends a write current $Iw=½\mu_p W/L(Vp2-Vtp)^2$ to the node NB. Here, $\mu_p$ is the mobility, W is a gate width, L is a gate length, and $V_{tp}$ is the threshold voltage. The switch MPS is provided between the node NB and the output node NA of the write current source 20. It should be noted that the parasitic capacitance Cc is accompanied in the Pch transistor MP.

The output node NA in the write current source 20 is connected through the X-side selector (X-side decoder) 21 to the memory cell array 10. The X-side selector 21 activates one selection line in accordance with a logical product of the decoder activation signal XDENW and the address signal XAn. Also, when the write signal WCSEN becomes High, the switch MPS is turned on. Consequently, the write current Iw from the write current source 20 is supplied to the memory cell (data storing element) 11 or the vicinity thereof. The write signal WCSEN is a signal for activating the write current source 20. That is, the write current source 20 generates a predetermined write current Iw based on the voltage Vp2 from the voltage generating circuit 1 in response to the write signal WCSEN. The X-side selector (X-side decoder) 21 is activated in response to the decoder activation signal XDENW to supply the predetermined write current Iw to the memory cell array 10.

According to this exemplary embodiment, the stabilization switch (SSW) 4 is interposed between the voltage generating circuit 1 and the first node N1. The stabilization switch 4 includes a transfer gate composed of a Pch transistor 41 and an Nch transistor 42, and an inverter 43. The decoder activation signal XDENW is supplied to this stabilization switch 4 from the control signal generating circuit 5. The decoder activation signal XDENW is supplied to the gate of the Pch transistor 41 and also supplied through the inverter 43 to the gate of the Nch transistor 42. Thus, when the X-side decoder 21 is activated (XDENW=High), the stabilization switch 4 is turned off. On the other hand, the X-side decoder 21 is deactivated (XDENW=Low), the stabilization switch 4 is turned on. In this way, the stabilization switch 4 operates in synchronization with the decoder activation signal XDENW and is turned on or turned off in response to the decoder activation signal XDENW.

When the decoder is deactivated (XDENW=Low), the stabilization switch 4 is turned on. Thus, the output voltage Vp1 of the voltage generating circuit 1 and the input voltage Vp2 to the write current source 20 becomes equal. On the other hand, when the decoder is activated (XDENW=High), the stabilization switch 4 is turned off. As a result, the route to and from which the current flows is removed from between the voltage generating circuit 1 and the stabilization capacitance 3. Thus, the accumulation phenomenon of the voltage variation as mentioned above is prevented.

Figure 12:
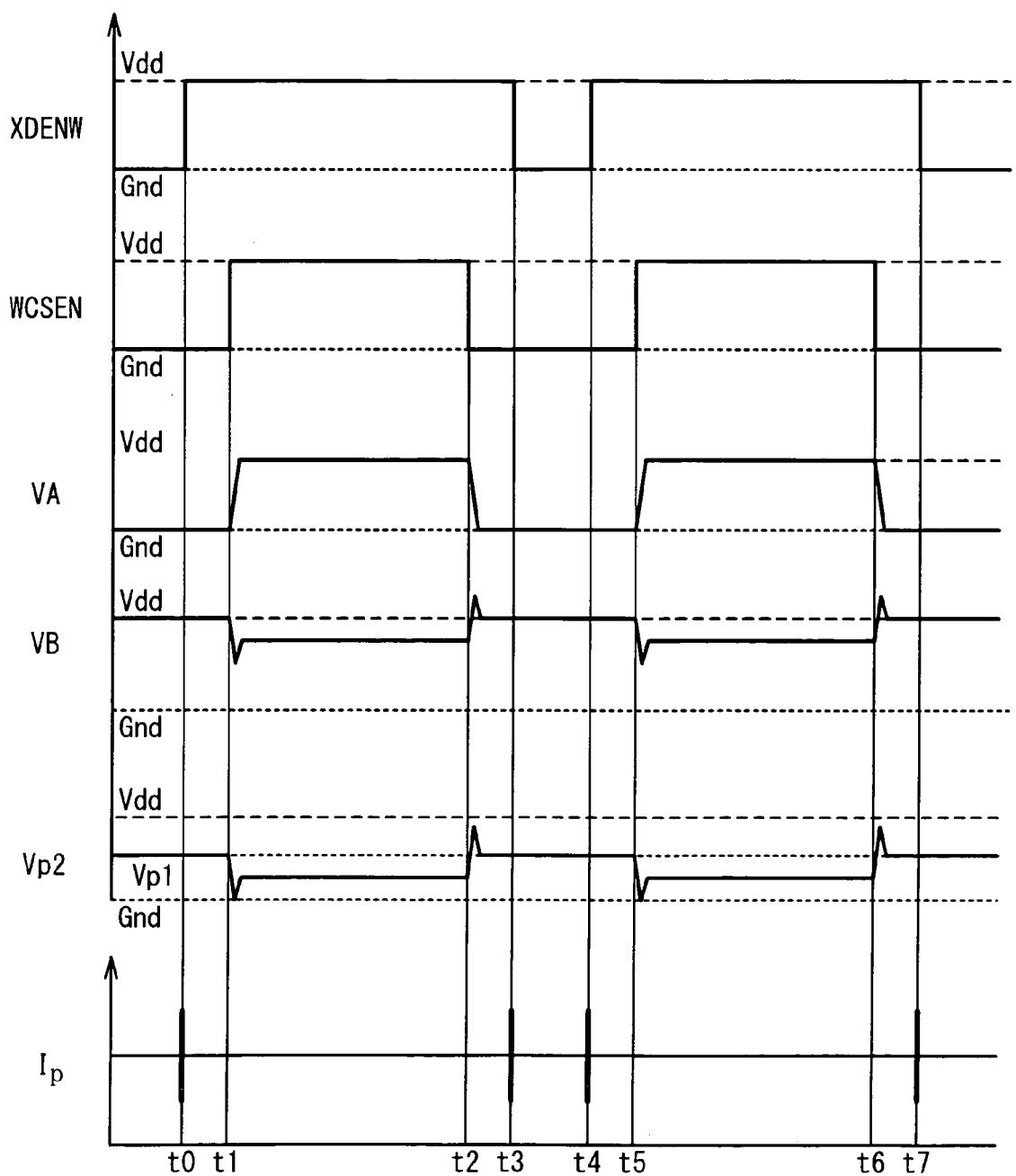
FIG. 12 is a diagram showing timing charts of an operation of the semiconductor integrated circuit according to the first exemplary embodiment.

FIG. 12 is a diagram of timing charts showing the operation of the semiconductor integrated circuit having such a configuration. In FIG. 12, the decoder activation signal XDENW, the write signal WCSEN, the voltage VA of the output node NA, the voltage VB of the node NB, the gate voltage Vp2 of the Pch transistor MP (the current source) and the current Ip flowing through the parasitic resistance r1 are shown. The respective signals are assumed such that the power supply voltage Vdd corresponds to the High level (H), and the ground Gnd corresponds to the Low level (L). The operation of the semiconductor integrated circuit according to this exemplary embodiment will be described below with reference to FIG. 11 and FIG. 12.

At the time of the standby, namely, when the write signal WCSEN is Low, the stabilization switch 4 is turned on. Thus, the gate voltage Vp2 of the Pch transistor MP is equal to the output voltage Vp1 (<the power supply voltage Vdd) of the voltage generating circuit 1. Also, at this time, the voltage VA of the output node NA is Low, and the voltage VB of the node NB is High.

At a time t0, the X-side decoder 21 is activated (XDENW=High). At this time, the stabilization switch 4 is turned off, and the first node N1 is electrically disconnected from the voltage generating circuit 1. Thus, the circuit composed of the current source MP, the stabilization capacitance 3, the stabilization switch 4 and the parasitic capacitance Cc is opened, thereby holding an internal charge amount. It should be noted that as shown in FIG. 12, although the current Ip slightly flows through the parasitic resistance r1, this is a noise due to the parasitic capacitance of the stabilization switch 4. The current Ip is a current having no relation with the voltage Vp2, and has no influence on the write current source 20.

At a time t1, the write signal WCSEN becomes High. As a result, the write current source 20 is activated, and the switch MPS is turned on. Consequently, the voltage VB of the node NB sharply falls toward the Low level. Also, the gate voltage Vp2 is decreased because of the coupling of the parasitic capacitance Cc in the current source MP. Thus, at this time point, the gate voltage Vp2 becomes lower than the voltage level Vp1. However, since the stabilization switch 4 is turned off, there is no current path from the voltage generating circuit 1 to the stabilization capacitance 3. Therefore, the current does not flow into the stabilization capacitance 3. In this way, it is important that the stabilization switch 4 is turned off previously to the time ti by a predetermined time. The stabilization switch 4 is turned off at least simultaneously with the time t1.

At a time t2, the write signal WCSEN becomes Low. As a result, the write current source 20 is deactivated, and the switch MPS is turned off. Thus, the voltage of the node NB sharply returns to Vdd. Also, the gate voltage Vp2 is increased because of the coupling of the parasitic capacitance Cc. However, since the stabilization switch 4 is turned off, the current does not flow into or from the circuit composed of the current source MP, the stabilization capacitance 3, the stabilization switch 4 and the parasitic capacitance Cc. Therefore, the gate voltage Vp2 is stabilized to the level prior to the activation of the write signal WCSEN, namely, the voltage level Vp1.

In succession, at a time t3, the X-side decoder 21 is deactivated (XDENW=Low). At this time, the stabilization switch 4 is turned on, and the first node N1 and the voltage generating circuit 1 are electrically connected. As a result, the gate voltage Vp2 is held at the level of the output voltage Vp1 of the voltage generating circuit 1. In this way, at the time of the completion of a first write operation, a difference is never generated between the gate voltage Vp2 and the voltage level Vp1. Thus, the accumulative voltage variation can be prevented. It is important that the stabilization switch 4 is turned on by a predetermined time after the time t3. At least simultaneously with the time t3, the stabilization switch 4 is turned on.

After that, in a period between a time t4 and a time t7, the write operation is performed similarly to the write operation in the period between the time t1 and the time t3. At the time of the completion of the previous write operation, the difference is not generated between the gate voltage Vp2 and the voltage level Vp1. Also, the difference is never generated even in the write operation at this time. In this way, the accumulative variation of the voltage Vp2 can be prevented.

With reference to FIG. 9 and FIG. 12, the control signal generating circuit 5 outputs the write signal WCSEN of the High level to the write current source 20, after the output of the decoder activation signal XDENW of the High level. Also, the control signal generating circuit 5 outputs the write signal XDENW of the Low level to the write current source 20, prior to the output of the decoder activation signal XDENW of the Low level. Consequently, the stabilization switch 4 is turned off at least for the period during which the write current source 20 is activated.

Figure 1A:
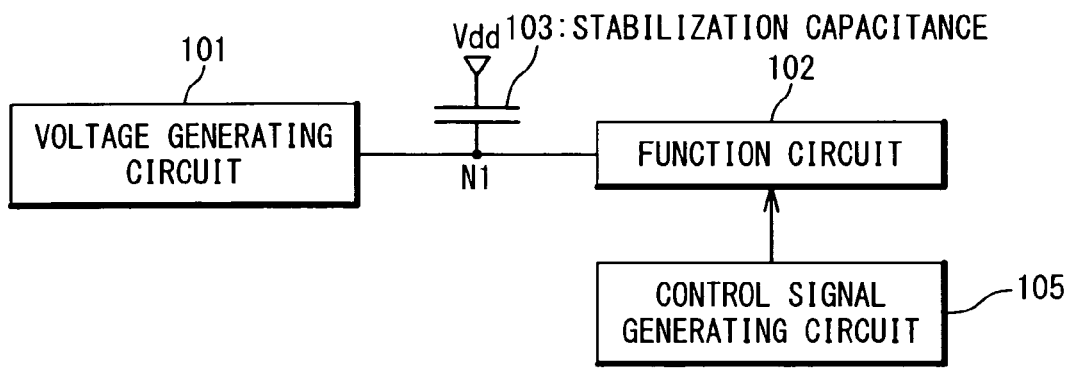
FIG. 1A is a block diagram showing the configuration of a related-art voltage stabilizing circuit.
Figure 1B:
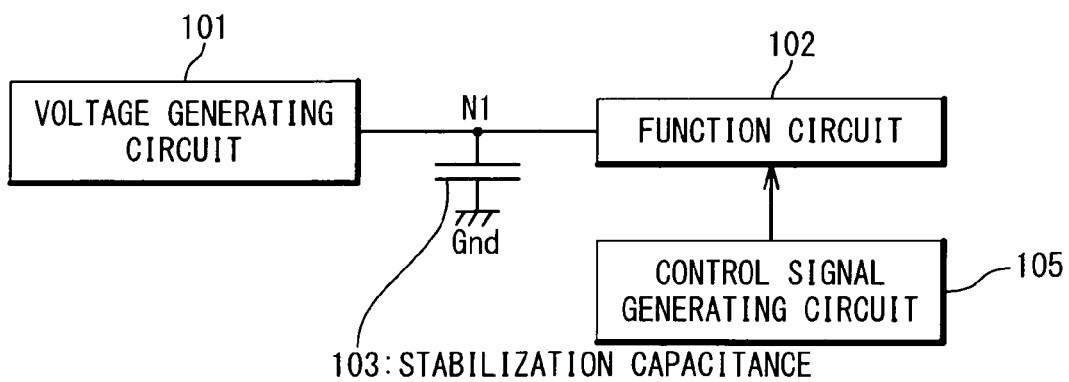
FIG. 1B is a block diagram showing the configuration of a related-art voltage stabilizing circuit.
Figure 2:
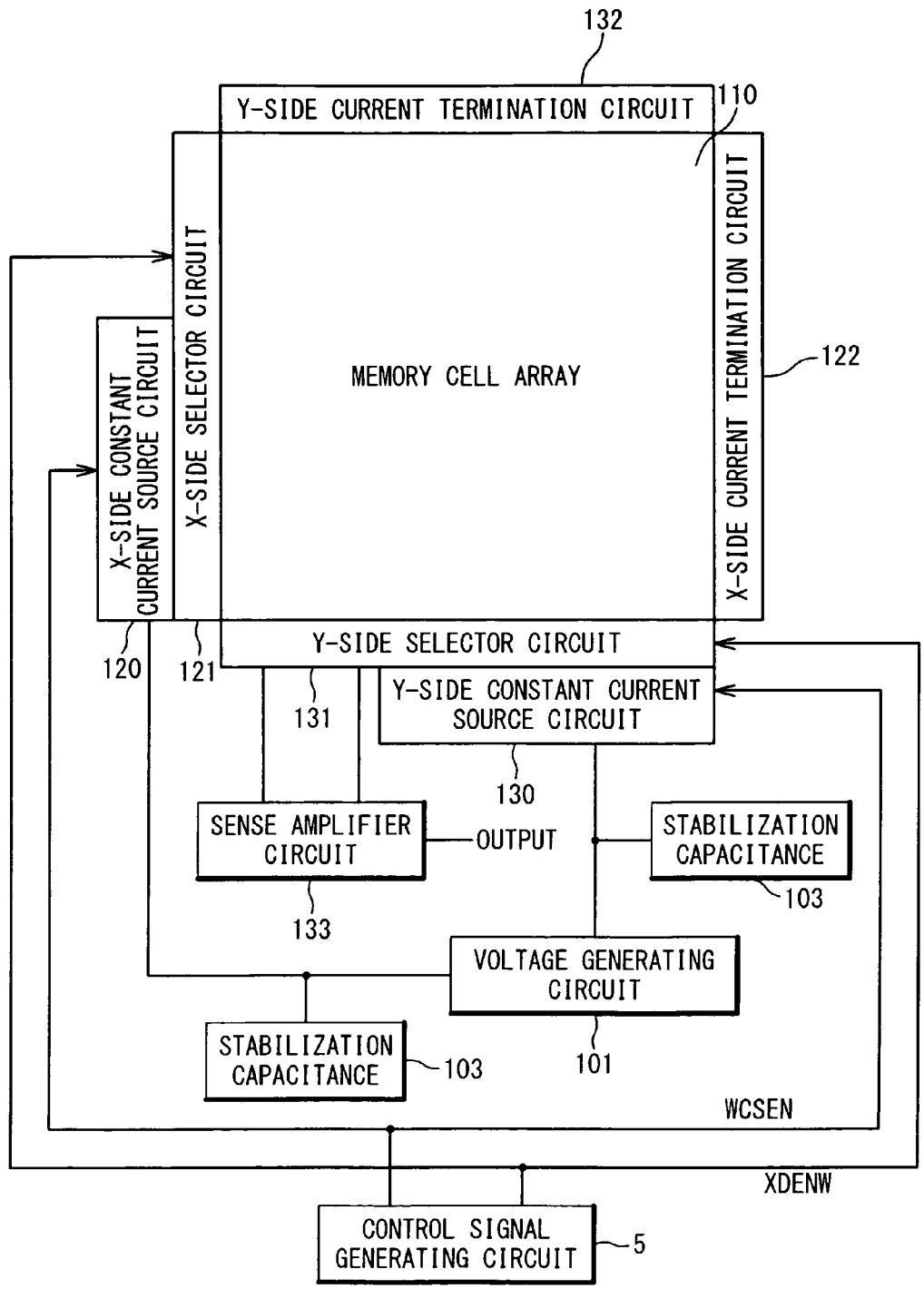
FIG. 2 is a block diagram showing the configuration of the related-art semiconductor integrated circuit.
Figure 3:
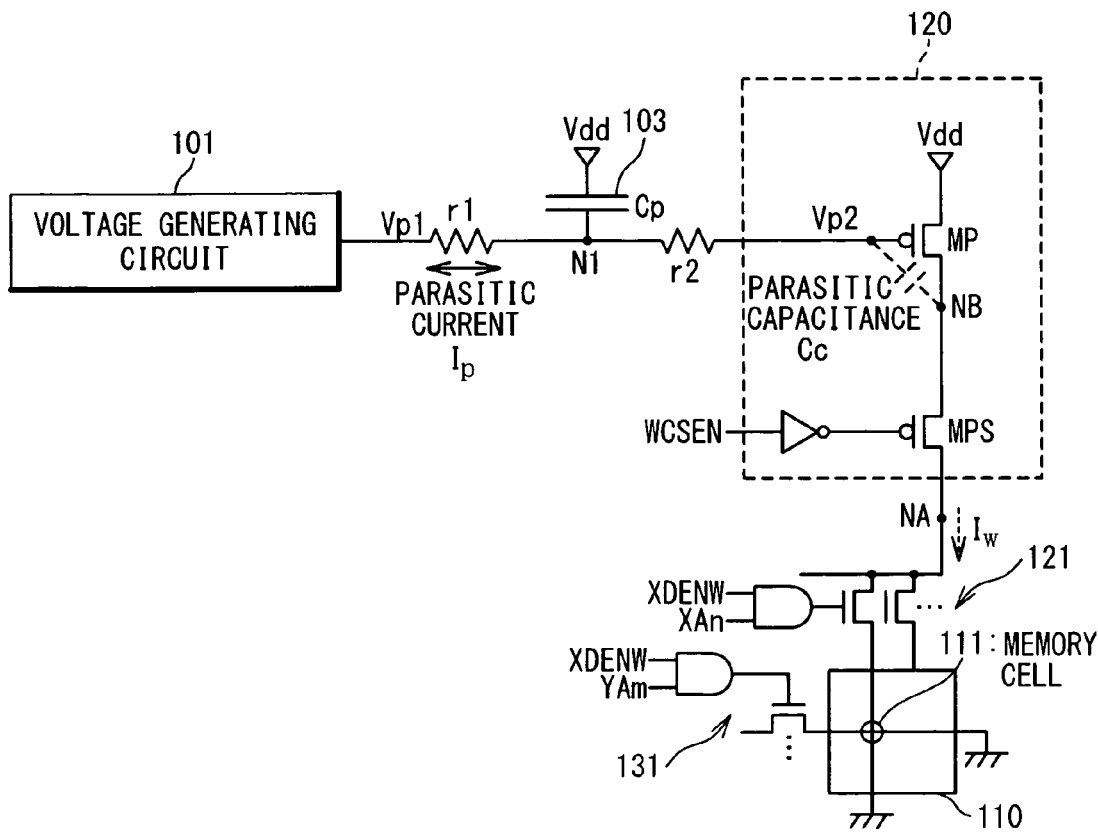
FIG. 3 is a circuit diagram showing a part of the configuration shown in FIG. 2.
Figure 4:
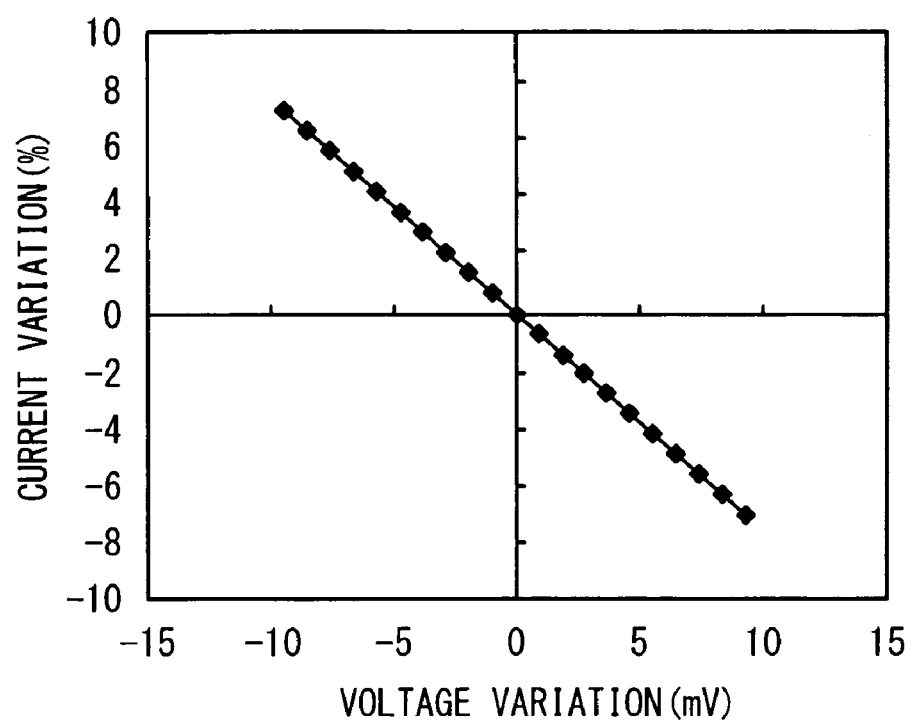
FIG. 4 is a diagraph showing a relation between voltage variation and current variation.
Figure 5:
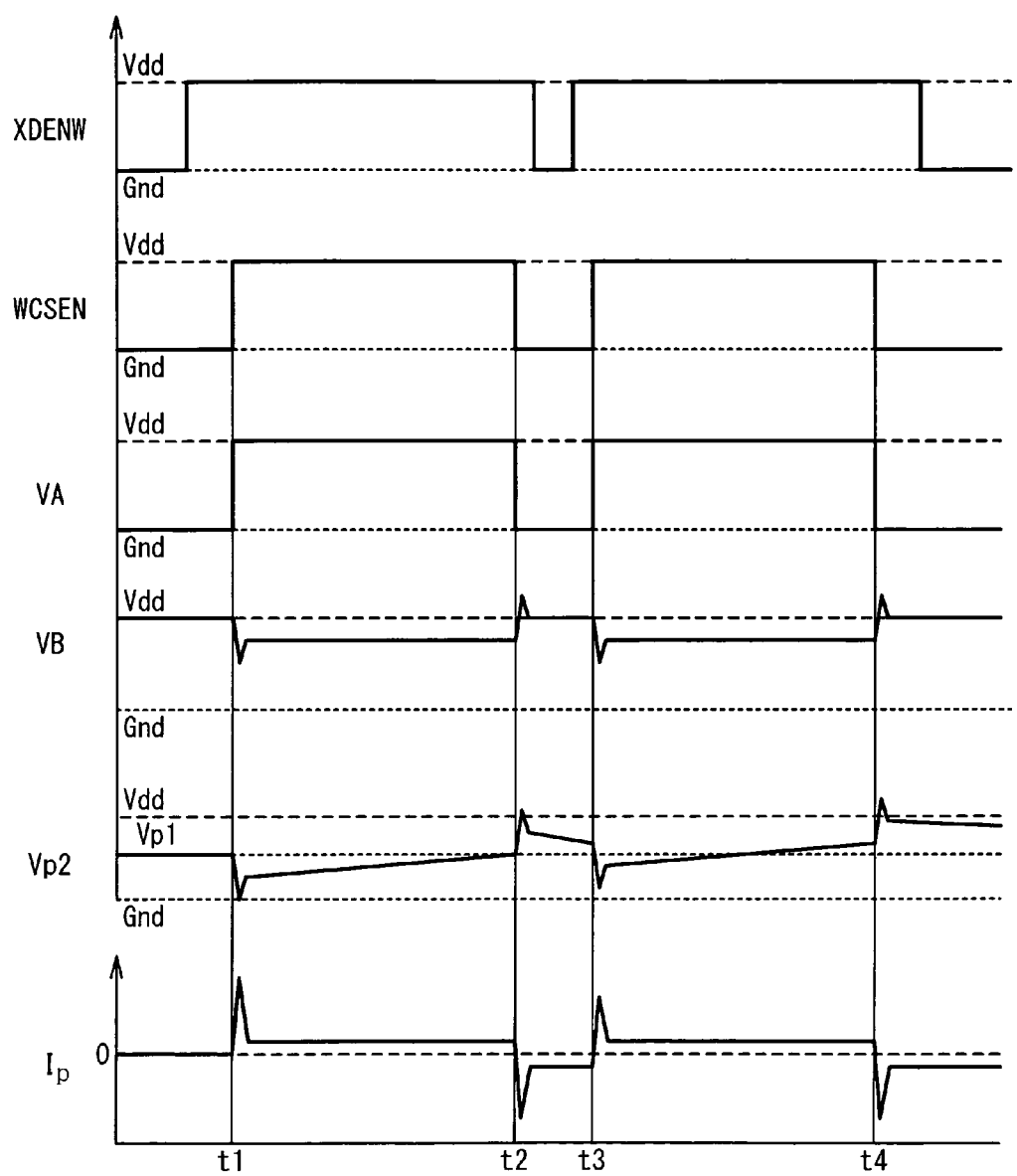
FIG. 5 is a diagram showing timing charts of the operation of the related-art semiconductor integrated circuit.
Figure 6:
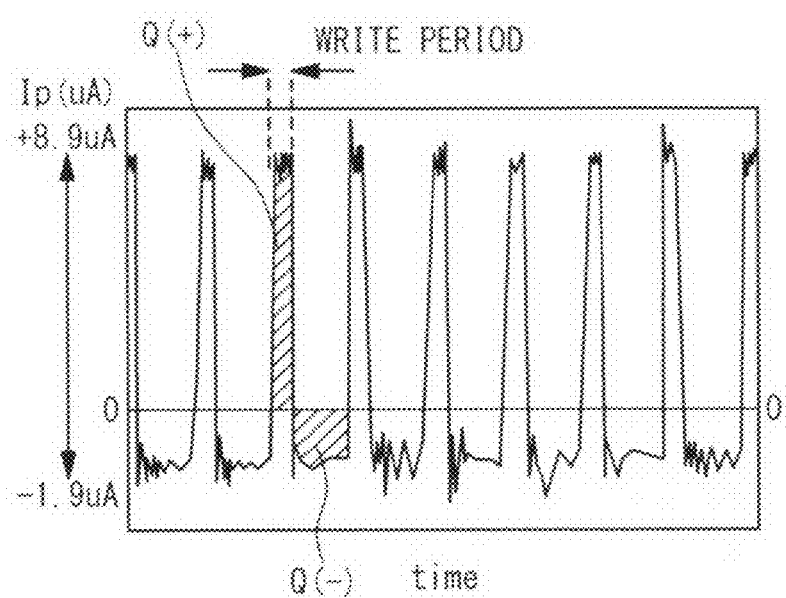
FIG. 6 is a graph for explaining a cause of the voltage variation.
Figure 7:
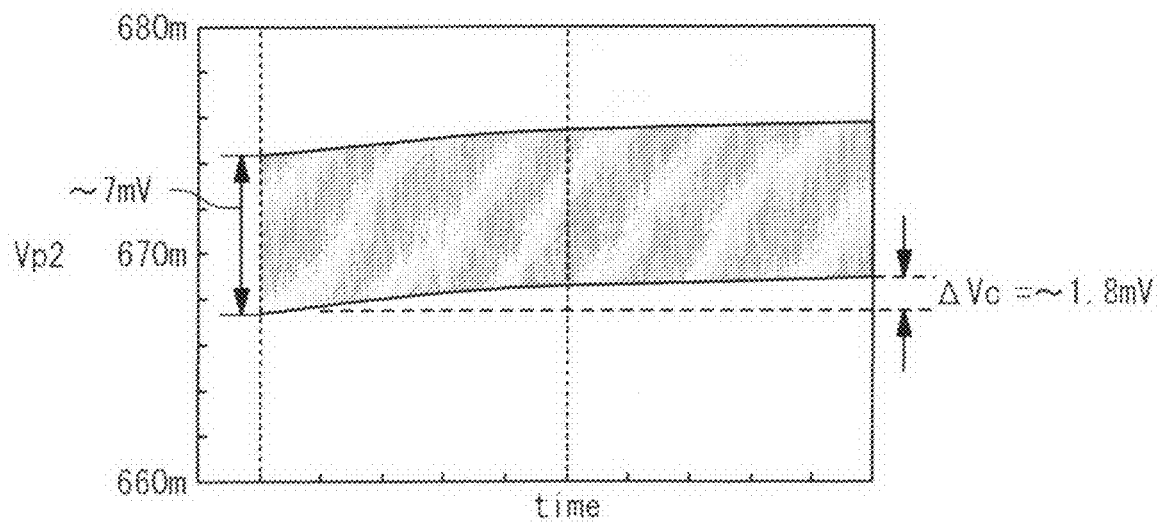
FIG. 7 is a graph showing the long-term voltage variation.
Figure 13:
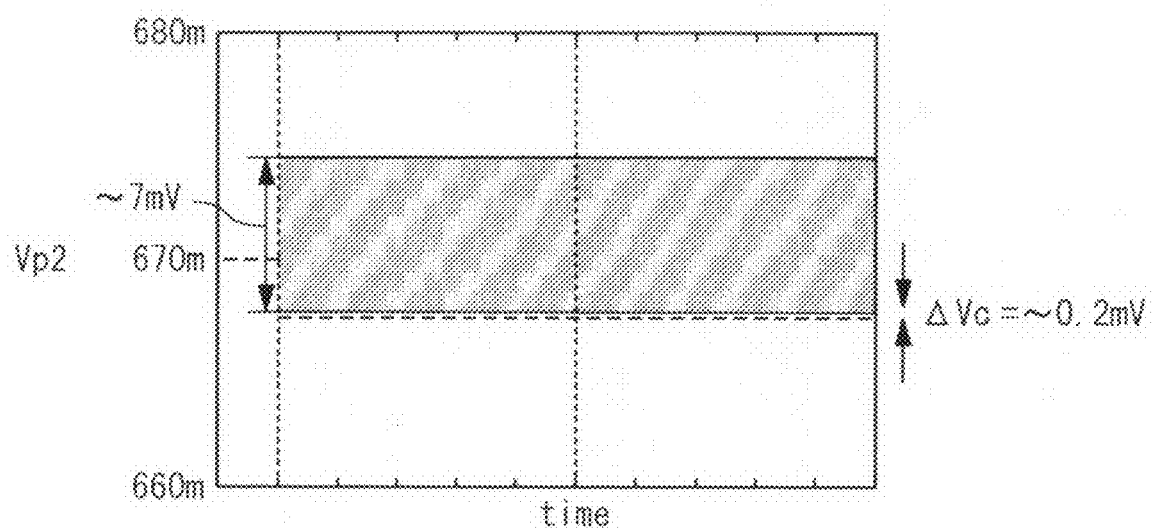
FIG. 13 is a graph showing the long-term voltage variation.

FIG. 13 shows the result of the SPICE simulation with regard to the foregoing circuit and the result corresponds to that of FIG. 7. In short, FIG. 13 shows the variation in the voltage Vp2 when the write operation is carried out 1000 times at the speed of 100 MHz. The voltage level Vp1 is assumed to be 675 mV. Because of the above coupling of the parasitic capacitance Cc, the voltage Vp2 is varied by about 7 mV for each write operation. However, this variation is not a problem because this is equal every time. From FIG. 13, the long-term variation amount ΔVc of the voltage Vp2 is known to be about 0.2 mV. The voltage variation of this degree can be substantially ignored with regard to the operation of the current source. As can be understood from the comparisons of FIG. 7 and FIG. 13, according to the present invention, the stable write current Iw can be supplied for the long term.

As mentioned above, according to the semiconductor integrated circuit according to this exemplary embodiment, the internal voltage from the voltage generating circuit 1 is instantly stabilized, and the voltage variation is not accumulated. The long-term voltage variation is prevented, thereby insuring that the internal voltage from the voltage generating circuit 1 is stabilized for the long term. Thus, the reliability of the semiconductor integrated circuit is improved. In particular, in case of the MRAM, the internal voltage is used to generate the write current Iw. Therefore, the stable write current Iw can be supplied to the memory cell array for the long term. This fact is preferable for the MRAM in which the high precision is required for the write current Iw.

Also, the internal voltage from the voltage generating circuit 1 is instantly stabilized. Thus, the operation of the function circuit 2 is not required to be kept waiting, until the stabilization of the internal voltage (until Vp2=Vp1 in the foregoing example). After a certain operation of the function circuit 2 is completed, the function circuit 2 can immediately perform the next operation. That is, the operation speed of the semiconductor integrated circuit is improved. In this way, according to this exemplary embodiment, the semiconductor integrated circuit and the MRAM that have the excellent reliability, yield and operation speed are provided.

Second Exemplary Embodiment

The semiconductor integrated circuit according to the second exemplary embodiment will be described below. According to this exemplary embodiment, the voltage variation in the output voltage Vp1 that is caused by the coupling noise current Ip (refer to FIG. 12) in the first exemplary embodiment is reduced. Thus, when the output voltage Vp1 of the voltage generating circuit 1 is used in another function circuit, this exemplary embodiment is especially preferable.

Figure 14:
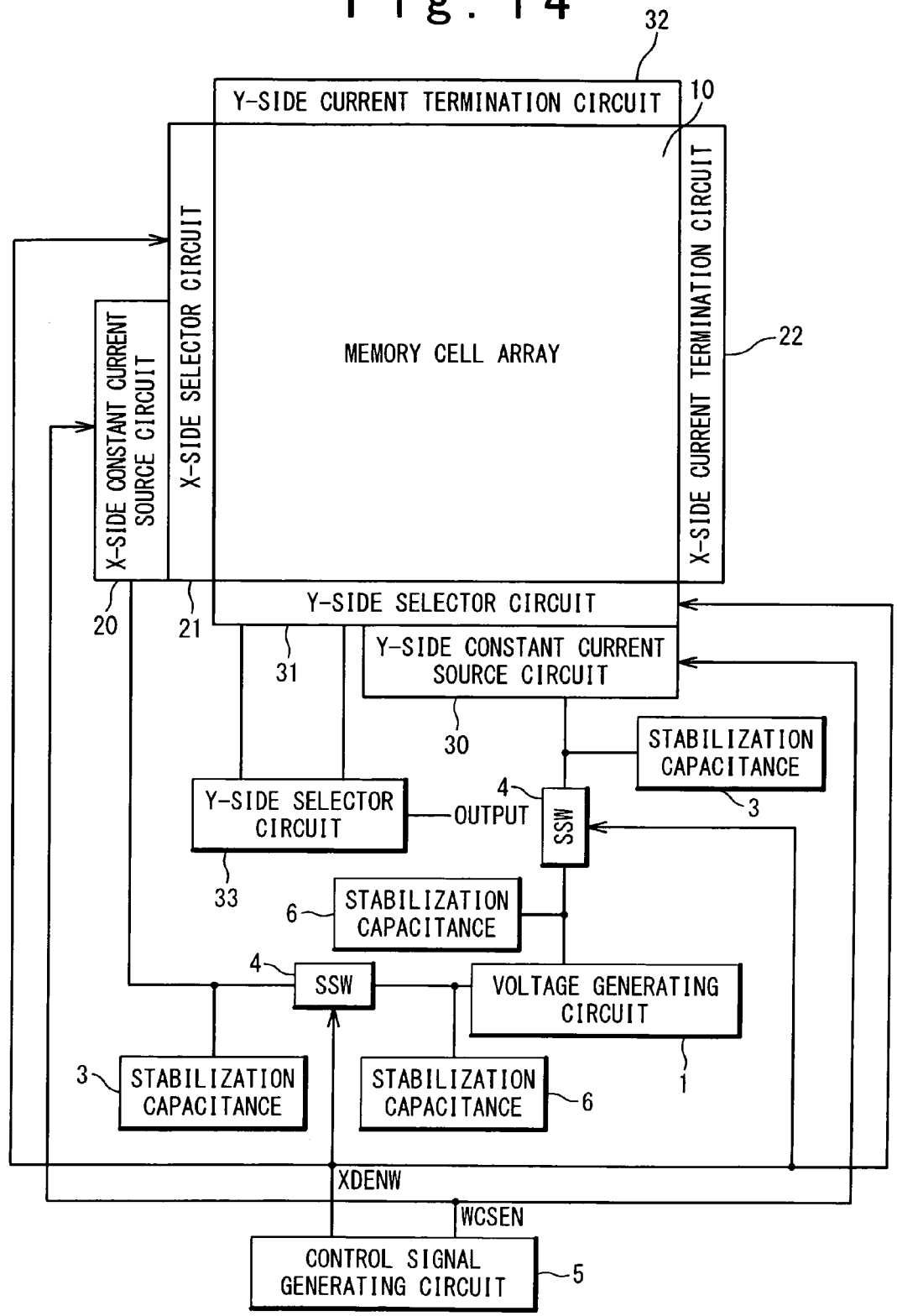
FIG. 14 is a block diagram showing the configuration of the semiconductor integrated circuit according to a second exemplary embodiment of the present invention.

FIG. 14 is a block diagram showing the configuration of the MRAM according to the second exemplary embodiment and corresponds to FIG. 9 in the first exemplary embodiment. In FIG. 14, the same reference numerals and symbols are assigned to the same components as those of FIG. 9, and the explanations are properly omitted. Similarly to the first exemplary embodiment, the stabilization capacitances 3 are inserted in parallel between the current source circuits (the function circuits) 20 and 30 and the stabilization switches 4. Also, the stabilization switch 4 is provided between the voltage generating circuit 1 and each of the stabilization capacitances 3. Moreover, according to this exemplary embodiment, a stabilization capacitance 6 is inserted in parallel between the voltage generating circuit 1 and each of the stabilization switches 4.

Figure 15:
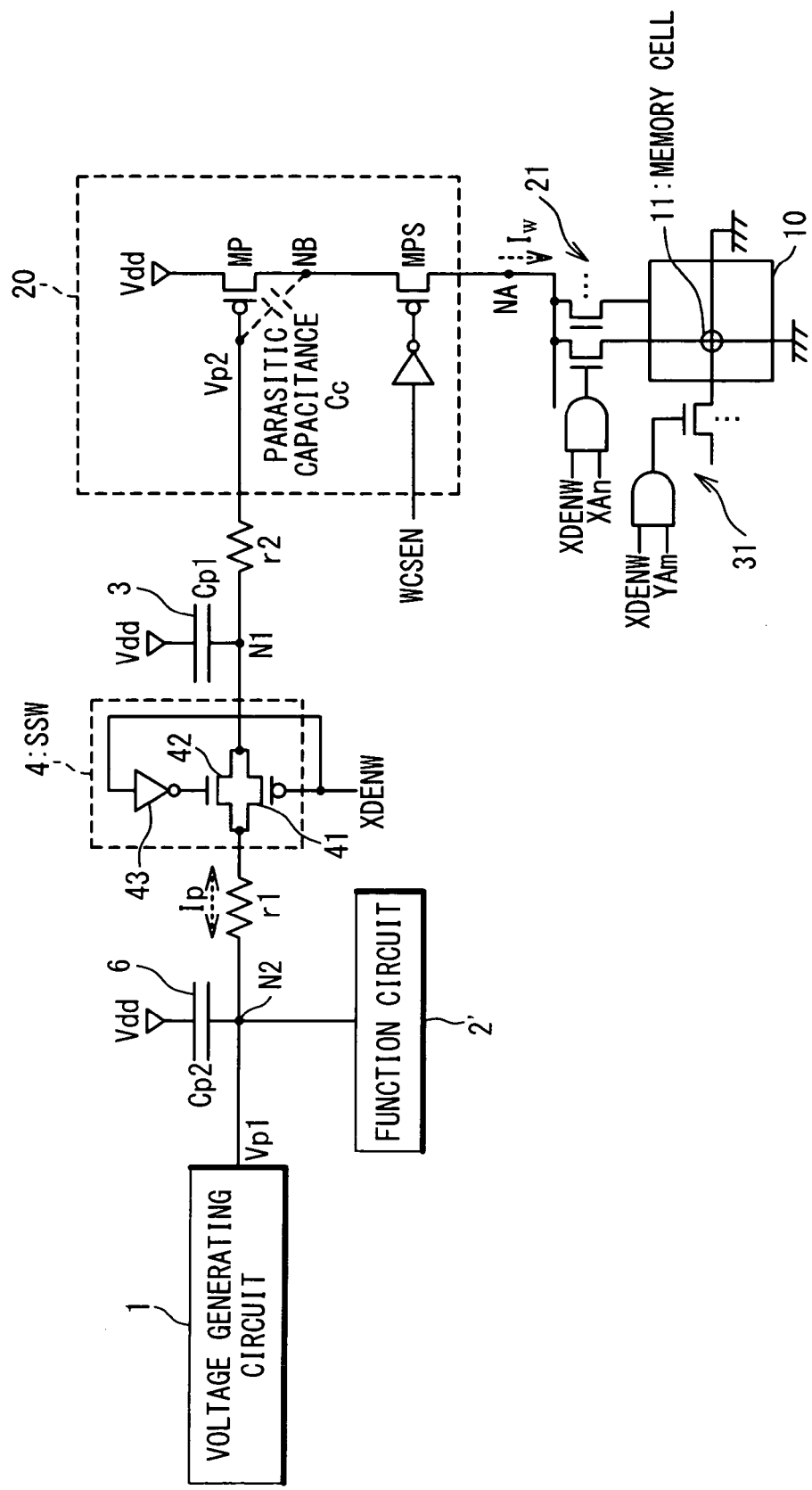
FIG. 15 is a circuit diagram showing a part of the configuration shown in FIG. 14.

FIG. 15 is a circuit diagram showing a part of the configuration shown in FIG. 14 in detail, and corresponds to FIG. 11 in the first exemplary embodiment. In FIG. 15, the same reference numerals and symbols are assigned to the same components as those of FIG. 11, and the explanation is properly omitted. The stabilization capacitance 3 (its capacitance value Cp1) is connected to the first node N1 between the write current source 20 and the stabilization switch (SSW) 4. The stabilization switch 4 is provided between the voltage generating circuit 1 and the first node N1. The stabilization switch 4 operates in synchronization with the decoder activation signal XDENW, and this is turned off in case of XDENW=High, and turned on in case of XDENW=Low. Thus, the accumulation phenomenon of the voltage variation is prevented.

Also, one end of another stabilization capacitance 6 (its capacitance value Cp2) is connected to the second node N2 between the voltage generating circuit 1 and the stabilization switch 4. The other end of the stabilization capacitance 6 is connected to the terminal of the power supply voltage Vdd. Moreover, another function circuit 2' is connected to the second node N2. The function circuit 2' operates by using the output voltage Vp1 of the voltage generating circuit 1.

Figure 16:
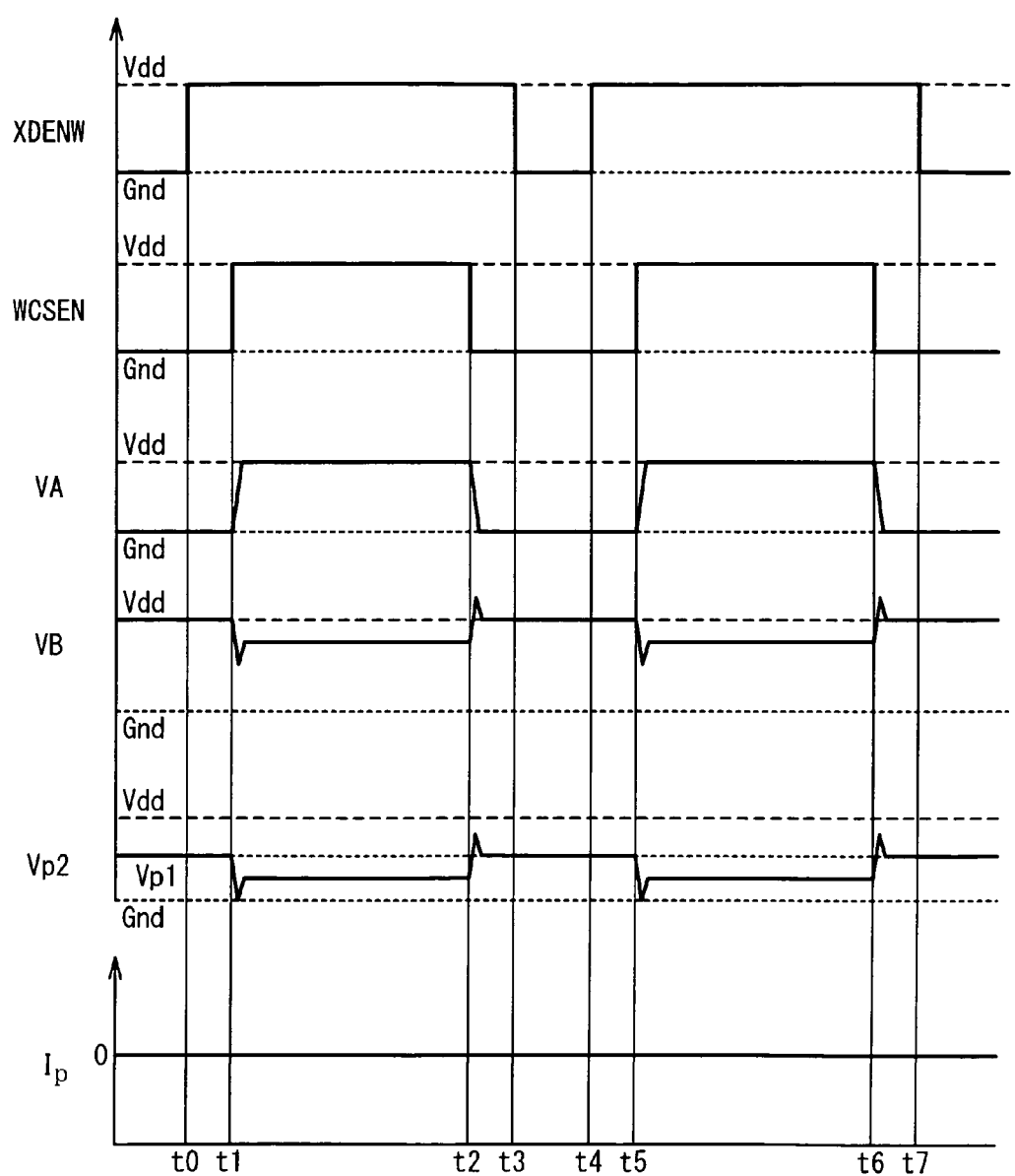
FIG. 16 is a diagram showing timing charts of an operation of the semiconductor integrated circuit according to the second exemplary embodiment.

FIG. 16 is a diagram showing timing charts of the operation of the semiconductor integrated circuit having such a configuration. In FIG. 16, the decoder activation signal XDENW, the write signal WCSEN, the voltage VA of the output node NA, the voltage VB of the node NB, the gate voltage Vp2 of the Pch transistor MP (current source) and the current Ip flowing through the parasitic resistance r1 are shown. The respective signals are assumed in such a manner that the power supply voltage Vdd corresponds to the High level (H), and the ground Gnd corresponds to the Low level (L). The operation according to this exemplary embodiment will be described below with reference to FIG. 15 and FIG. 16, as mentioned above.

At the time of the standby, namely, when the write signal WCSEN is Low, the stabilization switch 4 is turned on. Thus, the gate voltage Vp2 of the Pch transistor MP is equal to the output voltage Vp1 (<the power supply voltage Vdd) of the voltage generating circuit 1. Also, at this time, the voltage VA of the output node NA is Low, and the voltage VB of the node NB is High.

At the time t0, the X-side decoder 21 is activated (XDENW=High). At this time, the stabilization switch 4 is turned off, and the first node N1 is electrically disconnected from the voltage generating circuit 1. Thus, the circuit composed of the current source MP, the stabilization capacitance 3, the stabilization switch 4 and the parasitic capacitance Cc is opened, thereby holding an internal charge amount. Also, the charge is slightly accumulated in a parasitic capacitance of the stabilization switch 4, and the coupling noise is generated in the first exemplary embodiment. On the other hand, in this exemplary embodiment, the stabilization capacitance 6 is additionally provided, which can substantially remove such coupling noise. When the output voltage Vp1 of the voltage generating circuit 1 is used in another function circuit 2', the influence of the coupling does not substantially appear. Thus, this is especially preferable.

At the time t1, the write signal WCSEN becomes High. As a result, the write current source 20 is activated, and the switch MPS is turned on. Consequently, the voltage VB of the node NB sharply decreases toward the Low level. Also, the gate voltage Vp2 decreases due to the coupling of the parasitic capacitance Cc in the current source MP. Thus, at this time point, the gate voltage Vp2 becomes lower than the voltage level Vp1. However, since the stabilization switch 4 is turned off, there is no current path from the voltage generating circuit 1 to the stabilization capacitance 3. Therefore, the current does not flow into the stabilization capacitance 3.

At the time t2, the write signal WCSEN becomes Low. As a result, the write current source 20 is deactivated, and the switch MPS is turned off. Thus, the voltage of the node NB sharply returns to Vdd. Also, the gate voltage Vp2 is increased due to the coupling of the parasitic capacitance Cc. However, since the stabilization switch 4 is turned off, the current does not flow into or from the circuit composed of the current source MP, the stabilization capacitance 3, the stabilization switch 4 and the parasitic capacitance Cc. Therefore, the gate voltage Vp2 is stabilized to the level prior to the activation of the write signal WCSEN, namely, the voltage level Vp1.

In succession, at the time t3, the X-side decoder 21 is deactivated (XDENW=Low). At this time, the stabilization switch 4 is turned on, and the first node N1 and the voltage generating circuit 1 are electrically connected. As a result, the gate voltage Vp2 is held at the level of the output voltage Vp1 of the voltage generating circuit 1. In this way, at the time of the completion of the first write operation, the difference is never generated between the gate voltage Vp2 and the voltage level Vp1. Thus, the accumulative voltage variation is prevented. After that, during the period between a time t4 and a time t7, the write operation is performed similarly to the write operation during the period between the time t1 and the time t3.

According to this exemplary embodiment, the effect similar to the first exemplary embodiment is obtained. That is, the long-term voltage variation is prevented, thereby insuring that the internal voltage from the voltage generating circuit 1 is stabilized for the long term. Thus, the reliability of the semiconductor integrated circuit is improved. Also, the operation speed of the semiconductor integrated circuit is improved. Moreover, according to this exemplary embodiment, it is possible to prevent the voltage variation in the output voltage Vp1 that is caused by the coupling noise. When the output voltage Vp1 of the voltage generating circuit 1 is used in another function circuit 2', this exemplary embodiment is especially effective.

Third Exemplary Embodiment

The semiconductor integrated circuit according to the third exemplary embodiment of the present invention will be described below. According to this exemplary embodiment, the stabilization switch 4 is applied to an analog circuit that requires a plurality of stabilization capacitances 3.

Figure 17:
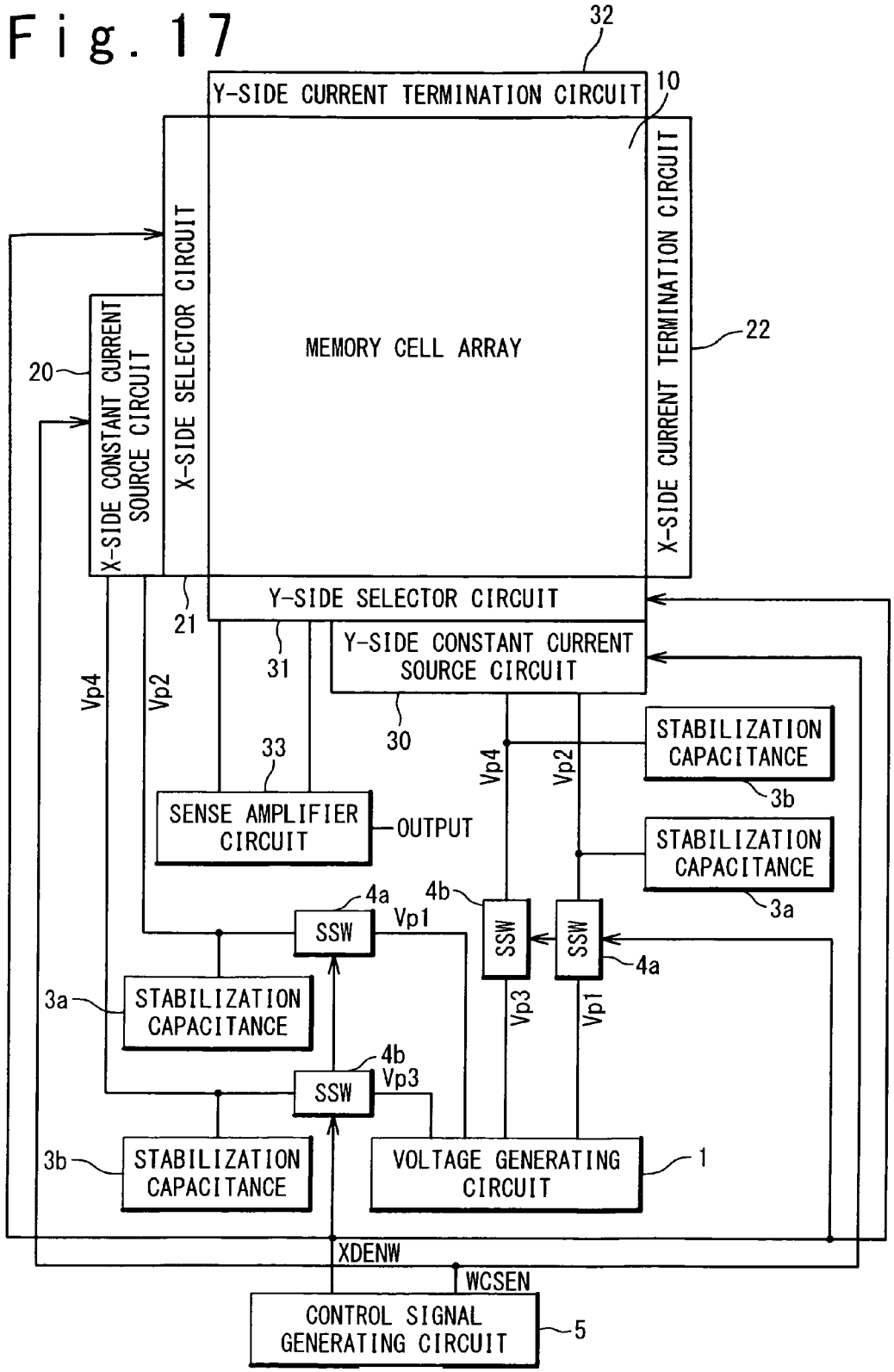
FIG. 17 is a block diagram showing the configuration of the semiconductor integrated circuit according to a third exemplary embodiment of the present invention.

FIG. 17 is a block diagram showing the configuration of the MRAM according to the third exemplary embodiment and corresponds to FIG. 9 in the first exemplary embodiment. In FIG. 17, the same reference numerals and symbols are assigned to the same components as those of FIG. 9, and the explanations thereof are properly omitted. In this exemplary embodiment, each of the current source circuits (function circuits) 20 and 30 is connected through a plurality of routes to the voltage generating circuit 1. The voltage generating circuit 1 generates a plurality of kinds of voltages (Vp1, Vp3) as the reference voltages for the plurality of routes. Each of the current source circuits 20 and 30 receives a plurality of kinds of voltages (Vp2. Vp4) through the plurality of routes and operates by using those voltages. Also, the stabilization capacitances 3 (3a, 3b) and the stabilization switches 4 (4a, 4b) are provided for the plurality of routes.

Figure 18:
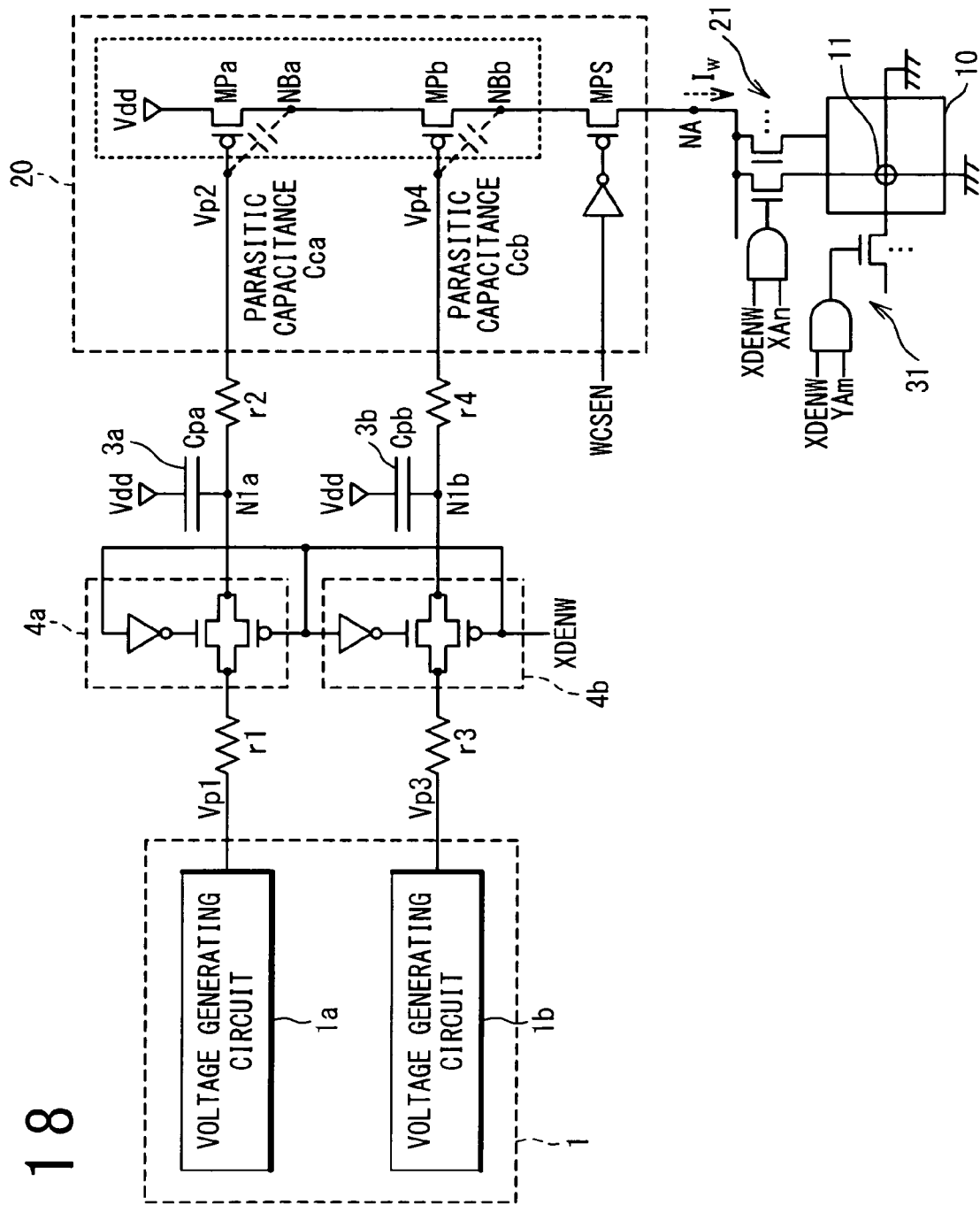
FIG. 18 is a circuit diagram showing a part of the configuration shown in FIG. 17.

FIG. 18 is a circuit diagram showing a part of the configuration shown in FIG. 17 in detail, and corresponds to FIG. 11 in the first exemplary embodiment. In FIG. 18, the same reference numerals and symbols are assigned to the same components as those of FIG. 11, and the explanations therefore are properly omitted.

The voltage generating circuit 1 includes a voltage generating circuit 1a for outputting the output voltage Vp1 and a voltage generating circuit 1b for outputting the output voltage Vp3. The output of the voltage generating circuit 1a is connected through parasitic resistances r1 and r2 and the stabilization switch 4a to the write current source 20. The stabilization capacitance 3a (its capacitance value Cpa) is connected to the first node N1a between the stabilization switch 4a and the write current source 20. Through this group, the voltage Vp2 is supplied to the write current source 20. On the other hand, the output of the voltage generating circuit 1b is connected through parasitic resistances r3 and r4 and the stabilization switch 4b to the write current source 20. The stabilization capacitance 3b (its capacitance value Cpb) is connected to the first node N1b between the stabilization switch 4b and the write current source 20. Through this group, the voltage Vp4 is supplied to the write current source 20.

The write current source 20 includes Pch transistors (current sources) Mpa and MPb that are cascade-connected. The Pch transistor MPa is connected to a node NBa, and the Pch transistor MPb is connected between the node NBa and the node NBb. The switch MPS is connected between the node NBb and the output node NA. The input voltages Vp2 and Vp4 of two groups are required for the sake of the two Pch transistors Mpa and MPb. Specifically, the input voltage Vp2 is applied as the gate voltage Vp2 to the gate of the Pch transistor MPa. On the other hand, the input voltage Vp4 is applied as the gate voltage Vp4 to the gate of the Pch transistor MPb. It should be noted that the parasitic capacitances of the Pch transistors Mpa and MPb are Cca and Ccb, respectively.

Even when there are the plurality of groups as mentioned above, the stabilization switches 4a and 4b operate similarly to the first exemplary embodiment. That is, each of the stabilization switches 4a and 4b operates in synchronization with the decoder activation signal XDENW and turned off in case of XDENW=High and turned on in case of XDENW=Low. Thus, the accumulation phenomenon of the voltage variation is prevented in each group.

Figure 19:
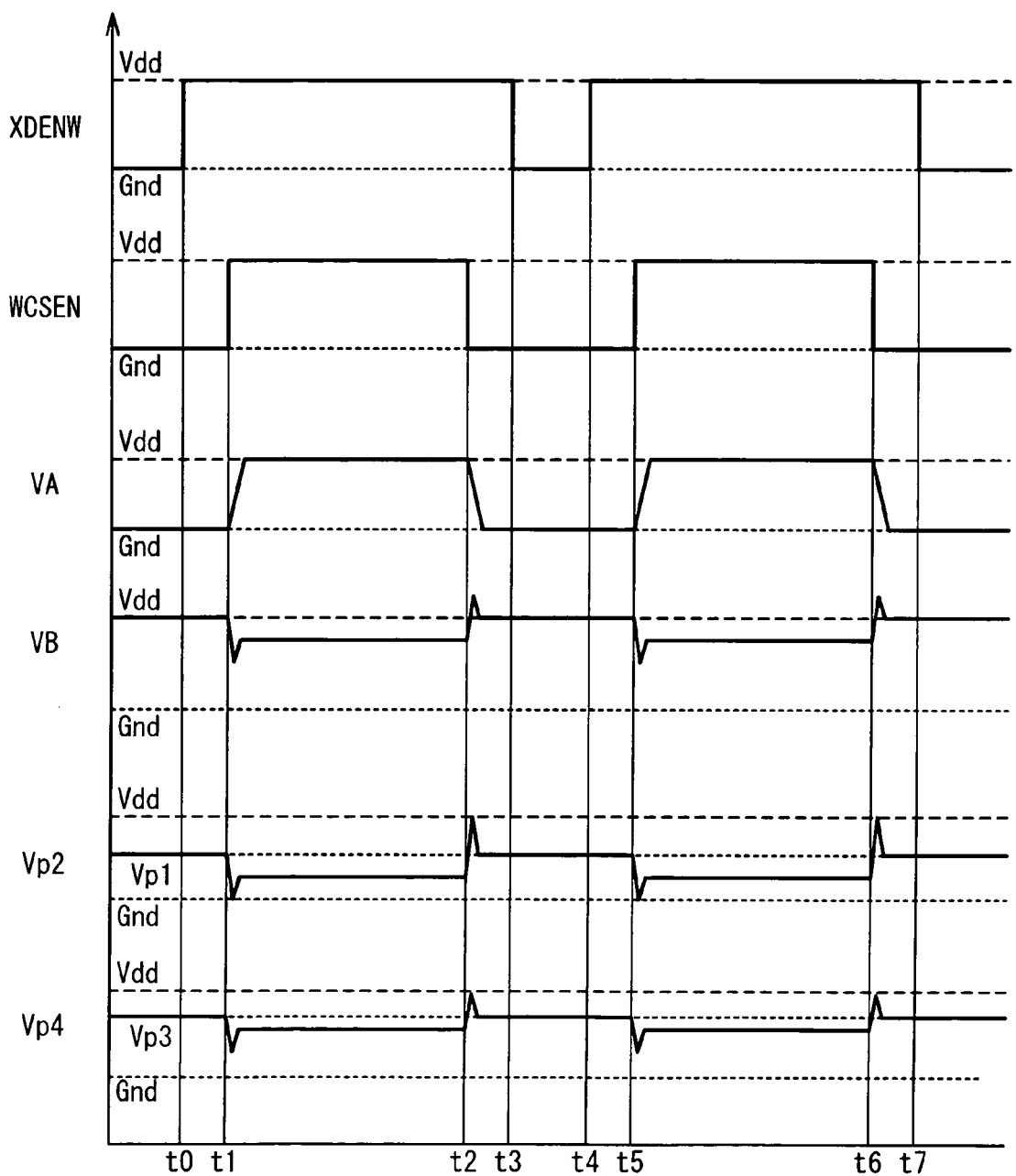
FIG. 19 is a diagram showing timing charts of an operation of the semiconductor integrated circuit according to the third exemplary embodiment.

FIG. 19 is a diagram showing timing charts of the operation of the semiconductor integrated circuit having such a configuration. In FIG. 19, the decoder activation signal XDENW, the write signal WCSEN, the voltage VA of the output node NA, the voltage VB of the node NBa or node NBb, the gate voltage Vp2 of the Pch transistor MPa (current source) and the gate voltage Vp4 of the Pch transistor MPb (current source) are shown. The respective signals are assumed such that the power supply voltage Vdd corresponds to the High level (H), and the ground Gnd corresponds to the Low level (L). The operation according to this exemplary embodiment will be described below with reference to FIG. 18 and FIG. 19, as mentioned above.

At the time of the standby, namely, when the write signal WCSEN is Low, the stabilization switch 4a (4b) is turned on. Thus, the gate voltage Vp2 (Vp4) is equal to the output voltage Vp1 (Vp3) of the voltage generating circuit 1a (1b). Also, at this time, the voltage VA of the output node NA is Low, and the voltage VB of the node NBa (NBb) is High.

At the time t0, the X-side decoder 21 is activated (XDENW=High). At this time, the stabilization switch 4a (4b) is turned off, and the first node N1a (N1b) is electrically disconnected from the voltage generating circuit 1a (1b). Thus, the circuit composed of the current source MPa (MPb), the stabilization capacitance 3a (3b), the stabilization switch 4a (4b) and the parasitic capacitance Cca (Ccb) is opened, thereby holding an internal charge amount.

At the time t1, the write signal WCSEN becomes High. As a result, the write current source 20 is activated, and the switch MPS is turned on. Consequently, the voltage VB of the node NBa (NBb) sharply decreases toward the Low level. Also, the gate voltage Vp2 (Vp4) decreases due to the coupling of parasitic capacitance Cca (Ccb) in the current source MPa (MPb). Thus, at this time point, the gate voltage Vp2 (Vp4) becomes lower than the voltage level Vp1 (Vp3). However, since the stabilization switch 4a (4b) is turned off, there is no current path from the voltage generating circuit 1a (1b) to the stabilization capacitance 3a (3b). Therefore, the current does not flow into the stabilization capacitance 3a (3b).

At the time t2, the write signal WCSEN becomes Low. As a result, the write current source 20 is deactivated, and the switch MPS is turned off. Thus, the voltage of the node NBa (NBb) sharply returns to Vdd. Also, the gate voltage Vp2 (Vp4) increases by the coupling of the parasitic capacitance Cca (Ccb). However, since the stabilization switch 4a (4b) is turned off, the current does not flow into or from the circuit composed of the current source MPa (MPb), the stabilization capacitance 3a (3b), the stabilization switch 4a (4b) and the parasitic capacitance Cca (Ccb). Therefore, the gate voltage Vp2 (Vp4) is stabilized to the level prior to the activation of the write signal WCSEN, namely, the voltage level Vp1 (Vp3).

In succession, at the time t3, the X-side decoder 21 is deactivated (XDENW=Low). At this time, the stabilization switch 4a (4b) is turned on, and the first node N1a (N1b) and the voltage generating circuit 1a (1b) are electrically connected. As a result, the gate voltage Vp2 (Vp4) is held at the level of the output voltage Vp1 (Vp3) of the voltage generating circuit 1a (1b). In this way, at the time of the completion of the first write operation, the difference is never generated between the gate voltage Vp2 (Vp4) and the voltage level Vp1 (Vp3). Thus, the accumulative voltage variation is prevented. After that, during the period between a time t4 and a time t7, the write operation is performed similarly to the write operation during the period between the time t1 and the time t3.

According to this exemplary embodiment, the effect similar to the first exemplary embodiment is obtained. That is, the long-term voltage variation is prevented, thereby insuring that the internal voltage from the voltage generating circuit 1 is stabilized for the long term. Thus, the reliability of the semiconductor integrated circuit is improved. Also, the operation speed of the semiconductor integrated circuit is improved. It should be noted that the second exemplary embodiment and the third exemplary embodiment can be combined.

Fourth Exemplary Embodiment

The semiconductor integrated circuit according to the fourth exemplary embodiment will be described below. In the above-mentioned exemplary embodiments, the stabilization switch 4 operates in synchronization with the decoder activation signal XDENW. In the fourth exemplary embodiment, the stabilization switch 4 operates at the timing that is not based on the decoder activation signal XDENW. Thus, even when the continuous write operation is performed, the gate voltage Vp2 can be stabilized.

Figure 20:
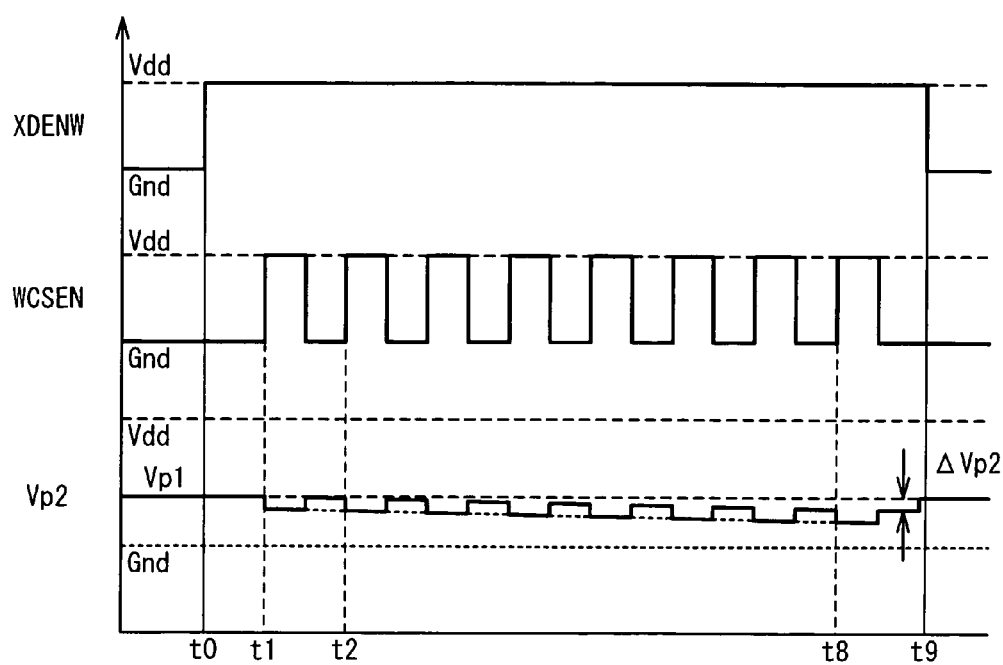
FIG. 20 is a diagram showing timing charts showing a continuous write operation.

In order to clarify the problem, the continuous write operation (burst write) in the first exemplary embodiment will be described below by referring to FIG. 20. FIG. 20 shows the decoder activation signal XDENW, the write signal WCSEN, and the gate voltage Vp2. At the time t0, the decoder activation signal XDENW is changed to High. After that, while the level of the decoder activation signal XDENW is kept, the write operation is continuously performed. Specifically, the continuous write operation is performed by continuously activating the write signal WCSEN at each of the times t1, t2, - - - , t8, or continuously changing write target addresses (not shown).

During the continuous write period, the level of the decoder activation signal XDENW is kept High. Thus, the terminal to which the gate voltage Vp2 is supplied is electrically disconnected from the voltage generating circuit 1, and this is in a high impedance (Hi-Z) state. As mentioned above, the circuit composed of the current source MP, the stabilization capacitance 3, the stabilization switch 4 and the parasitic capacitance Cc is opened. Thus, the internal charge amount is held in principle. Therefore, after each write operation, the gate voltage Vp2 ought to be held at the voltage level Vp1.

However, when because of a manufacturing process defect and the like, there is a leakage current path, the gate voltage Vp2 is varied, as shown in FIG. 20. In FIG. 20, the variation in the gate voltage Vp2 that is caused by this leakage current is represented by ΔVp2. When the decoder activation signal XDENW becomes Low at a time t9, the voltage generating circuit 1 and the current source 20 are finally connected. Thus, the gate voltage Vp2 is returned to the voltage level Vp1. However, in order to protect the foregoing voltage variation in the continuous write operation period, the time while the voltage generating circuit 1 and the write current source 20 are connected is desired to be reserved as much as possible. To do so, ON/OFF of the stabilization switch 4 is required to be controlled in response to a signal other than the decoder activation signal XDENW.

Figure 21:
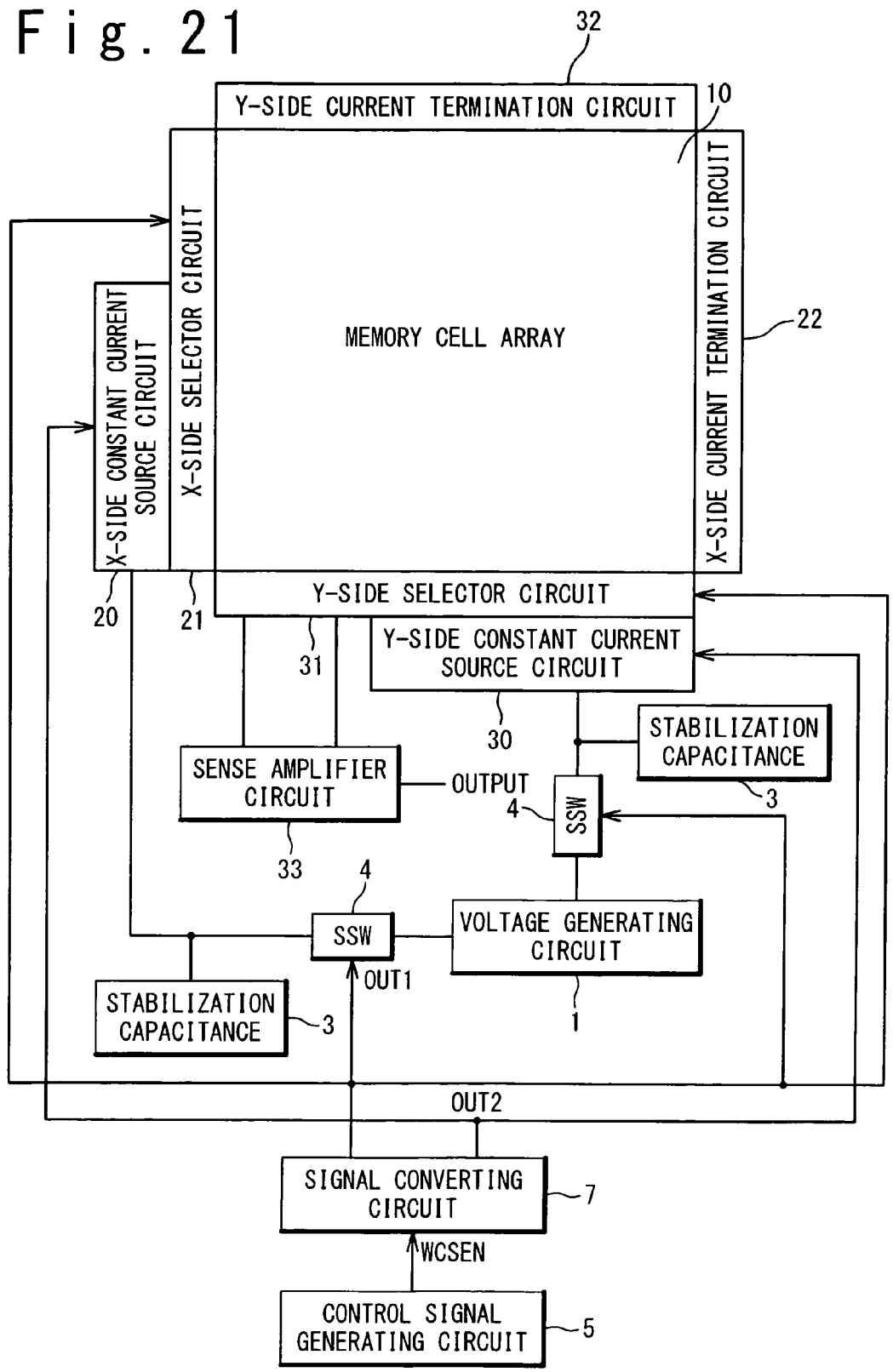
FIG. 21 is a block diagram showing the configuration of the semiconductor integrated circuit according to a fourth exemplary embodiment of the present invention.

FIG. 21 is a block diagram showing the configuration of the MRAM according to the fourth exemplary embodiment and corresponds to FIG. 9 in the first exemplary embodiment. In FIG. 21, the same reference numerals and symbols are assigned to the same components as those of FIG. 9, and the explanations thereof are properly omitted. The control signal generating circuit 5 outputs the write signal WCSEN to a signal converting circuit 7. The signal converting circuit 7 generates a first control signal OUT1 and a second control signal OUT2 in response to the input write signal WCSEN. The first control signal OUT1 functions as the decoder activation signal XDENW in the above-mentioned exemplary embodiments, and this is supplied to the X-side selector 21, the Y-side selector 31 and the stabilization switch 4. The second control signal OUT2 functions as the write signal WCSEN in the above-mentioned exemplary embodiments, and this is supplied to the X-side constant current source circuit 20 and the Y-side constant current source circuit 30.

Figure 22:
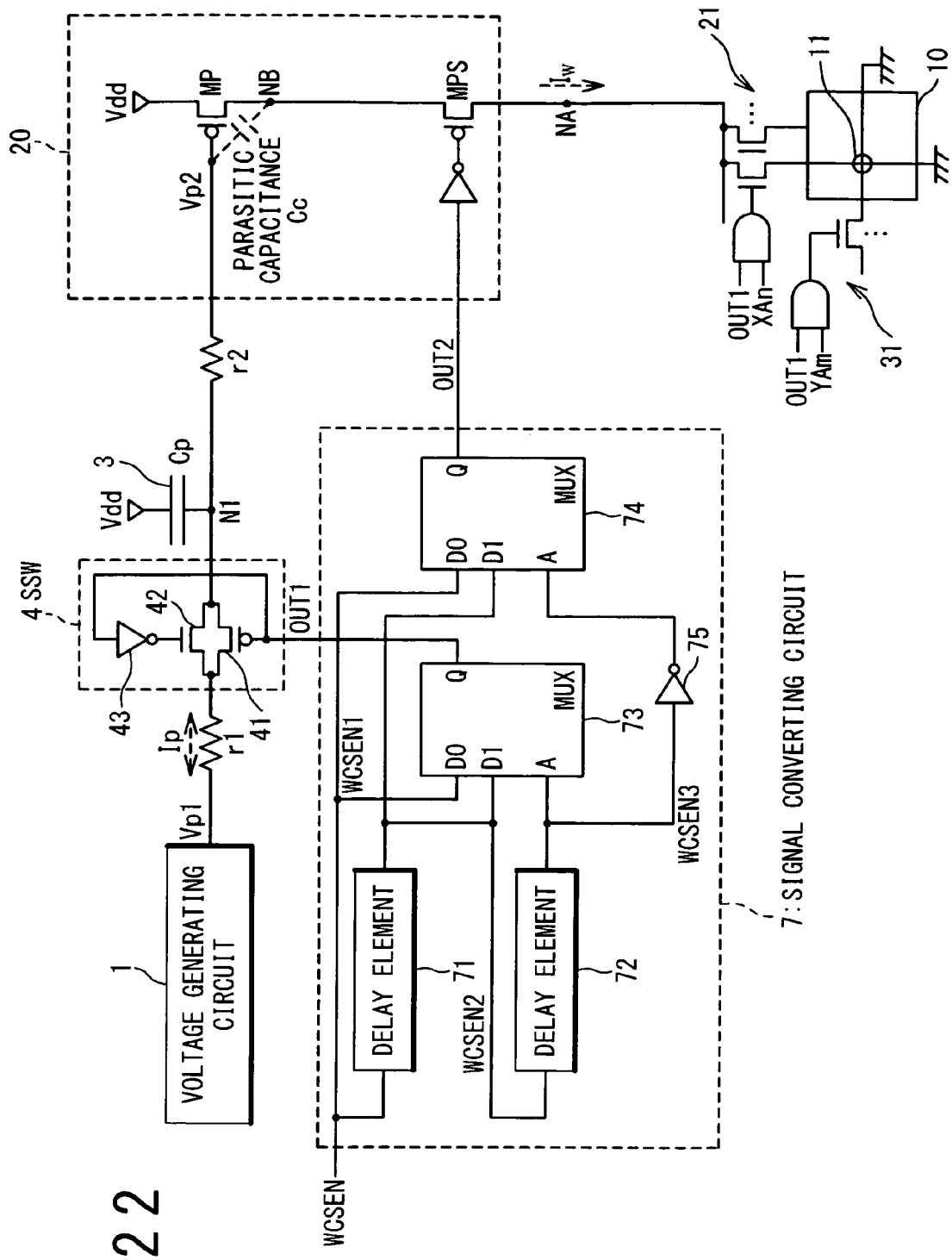
FIG. 22 is a circuit diagram showing a part of the configuration shown in FIG. 21.

FIG. 22 is a circuit diagram showing a part of the configuration shown in FIG. 21 in detail and corresponds to FIG. 11 in the first exemplary embodiment. In FIG. 22, the same reference numerals and symbols are assigned to the same components as those FIG. 11, and the explanations thereof are properly omitted.

The X-side selector 21 activates one selection line in accordance with a logical product of the first control signal OUT1 and an address signal XAn. The first control signal OUT1 is a control signal for activating the X-side selector (X-side decoder) 21. Also, when the second control signal OUT2 becomes High, the switch MPS of the write current source 20 is turned on. Consequently, the write current Iw from the write current source 20 is supplied to the memory cell (data storing element) 11 or the vicinity thereof. The second control signal OUT2 is a signal for activating the write current source 20.

The stabilization capacitance 3 is connected to the first node N1 between the write current source 20 and the stabilization switch (SSW) 4. The stabilization switch 4 is provided between the voltage generating circuit 1 and the first node N1. The stabilization switch 4 operates in synchronization with the first control signal OUT1, and this is turned off in case of OUT1=High and turned on in case of OUT2=Low. Thus, the accumulation phenomenon of the voltage variation is prevented.

Also, FIG. 22 shows one example of the configuration of the signal converting circuit 7. In FIG. 22, the signal converting circuit 7 is provided with delay elements 71 and 72, multiplexers 73 and 74 and an inverter 75. The write signal WCSEN is supplied as a signal WCSEN1 to the delay element 71 and data terminals D0 of the multiplexers 73 and 74. A signal WCSEN2 outputted by the delay element 71 is supplied to the delay element 72 and data terminals D1 of the multiplexers 73 and 74. A signal WCSEN3 outputted by the delay element 72 is supplied to an input terminal A of the multiplexer 73 and an input terminal A of the multiplexer 74 through the inverter 75. Each of the multiplexers 73 and 74 is designed to output the signal on the data terminal D when the input A is at the Low level, and output the signal on the data terminal D1 when the input A is'at the High level. The output signal of the multiplexer 73 is the first control signal OUT1, and the output signal of the multiplexer 74 is the second control signal OUT2.

Figure 23:
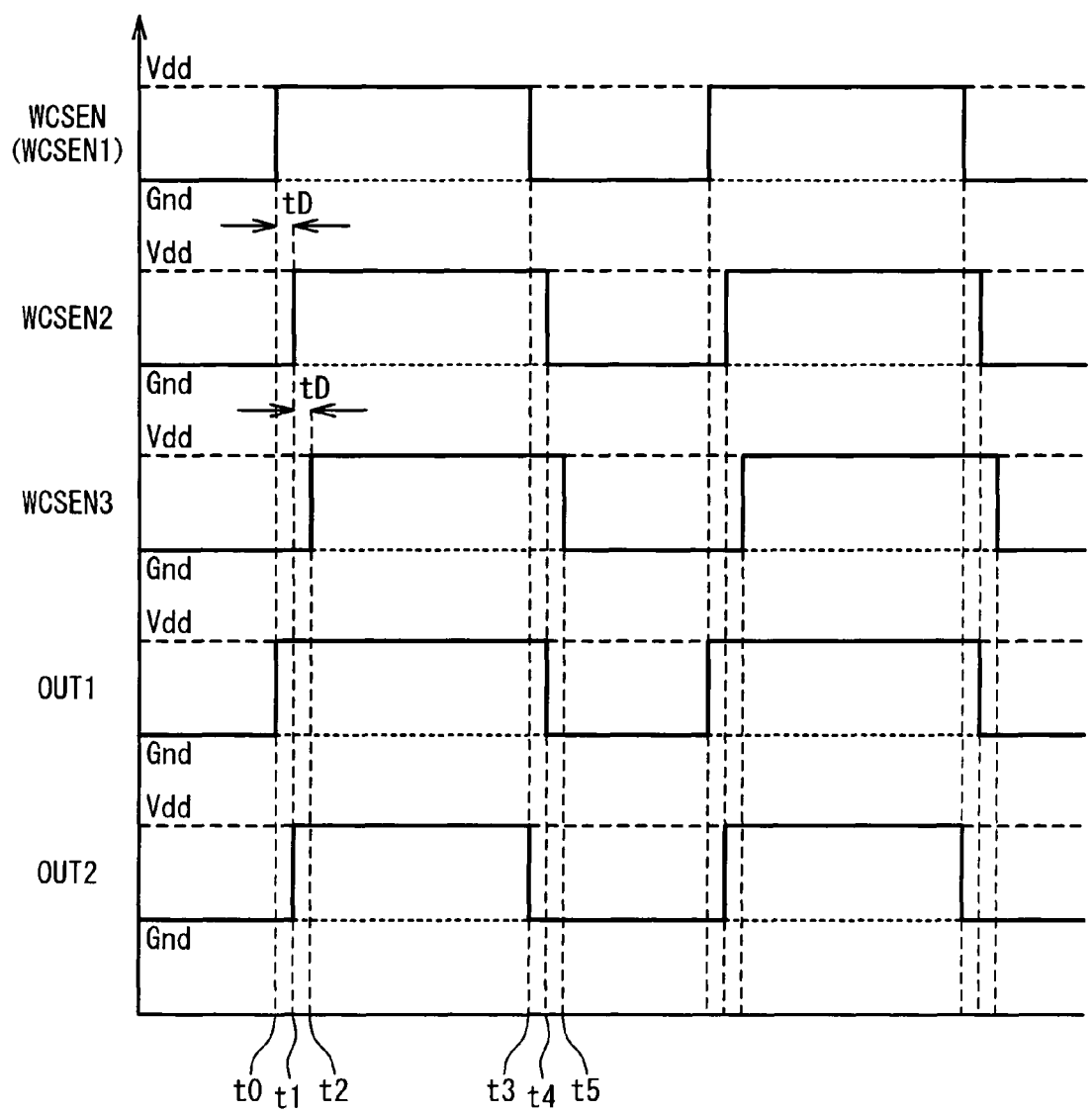
FIG. 23 is a diagram showing timing charts of an operation of a signal converting circuit according to the fourth exemplary embodiment.

A diagram showing the operation timing charts of the thus-configured signal converting circuit 7 is shown in FIG. 23. When the write signal WCSEN (WCSEN1) becomes High at a time t0, the signal WCSEN2 becomes High at a time t1 after a time tD. Moreover, the signal WCSEN3 becomes High at a time t2 after the time tD. Also, when the write signal WCSEN (WCSEN1) becomes Low at a time t3, the signal WCSEN2 becomes Low at a time t4 after the time tD. Moreover, the signal WCSEN3 becomes Low at a time t5 after the time tD. The signal WCSEN2 is a signal after delayed by a delay time tD from the signal WCSEN1, and the signal WCSEN3 is a signal after delayed by a delay time 2tD from the signal WCSEN1.

Such signals WCSEN1 to WCSEN3 determine the first control signal OUT1 and the second control signal OUT2. Specifically, the first control signal OUT1 rises at the time t0 and falls at the time t4. On the other hand, the second control signal OUT2 rises at the time t1 and falls at the time t3. In short, the first control signal OUT1 is generated, which rises earlier than the second control signal OUT2 and falls later than the second control signal OUT2. Thus, the stabilization switch 4 can be turned off for the period during while the write current source 20 is activated at least. The timings of the first control signal OUT1 and the second control signal OUT2 can be freely set by the delay elements 71 and 72.

Figure 24:
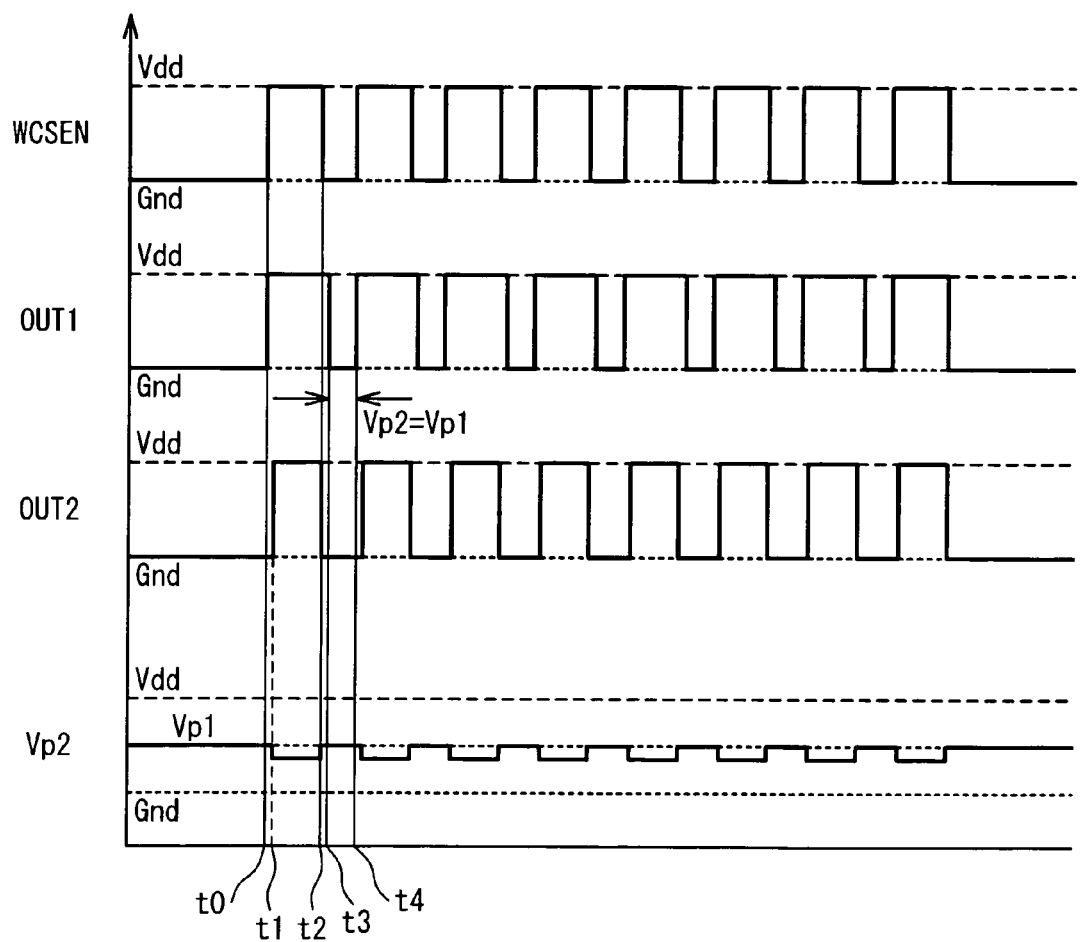
FIG. 24 is a diagram showing timing charts of a continuous write operation according to the fourth exemplary embodiment.

FIG. 24 is a diagram showing timing charts of the operation of the semiconductor integrated circuit having the foregoing configuration. FIG. 24 shows the write signal WCSEN, the first control signal OUT1, the second control signal OUT2 and the gate voltage Vp2 of the Pch transistor MP (current source). The continuous write operation according to this exemplary embodiment will be described below with reference to FIG. 22 and FIG. 24 as mentioned above.

At the time of the standby, namely, when the write signal WCSEN is Low, the first control signal OUT1 is also Low, and the stabilization switch 4 is turned on. Thus, the gate voltage Vp2 of the Pch transistor MP is equal to the output voltage Vp1 (<the power supply voltage Vdd) of the voltage generating circuit 1. Also, at this time, the voltage VA of the output node NA is Low, and the voltage VB of the node NB is High.

At the time t0, the write signal WCSEN is changed to High. Consequently, the first control signal OUT1 is also changed to High. As a result, the stabilization switch 4 is turned off, and the first node N1 is electrically disconnected from the voltage generating circuit 1. Thus, the circuit composed of the current source MP, the stabilization capacitance 3, the stabilization switch 4 and the parasitic capacitance Cc is opened, thereby holding an internal charge amount.

At the time t1 (=t0+tD) after the delay time tD, the second control signal OUT2 becomes High. As a result, the write current source 20 is activated, and the switch MPS is turned on. Thus, the voltage VB of the node NB sharply decreases toward the Low level. Also, the gate voltage Vp2 decreases due to the coupling of the parasitic capacitance Cc of the current source MP. Thus, at this time point, the gate voltage Vp2 is lower than the voltage level Vp1. However, since the stabilization switch 4 is turned off, there is no current route from the voltage generating circuit 1 and the stabilization capacitance 3. Therefore, the current does not flow into the stabilization capacitance 3.

Next, at the time t2, the write signal WCSEN is changed to Low. Consequently, the second control signal OUT2 is also changed to Low. As a result, the write current source 20 is deactivated, and the switch MPS is turned off. Thus, the voltage of the node NB sharply returns to Vdd% Also, the gate voltage Vp2 increases due to the coupling of the parasitic capacitance Cc. However, since the stabilization switch 4 is turned off, the current does not flow into or from the circuit composed of the current source MP, the stabilization capacitance 3, the stabilization switch 4 and the parasitic capacitance Cc. Therefore, the gate voltage Vp2 is stabilized to the level prior to the activation of the write signal WCSEN, namely, the voltage level Vp1. When there is a leakage path, the gate voltage Vp2 becomes at the level slightly different from the voltage level Vp1. However, this is not a problem because the write activation time is very short, such as several ns to several 10 ns, and the variation amount is equal every time.

At the time t3 (=t2+tD) after the delay time tD, the first control signal OUT1 becomes Low. At this time, the stabilization switch 4 is turned on, and the first node N1 and the voltage generating circuit 1 are electrically connected. As a result, the gate voltage Vp2 is held at the level of the output voltage Vp1 of the voltage generating circuit 1. This state is held in the period until the next write operation (until t4).

Thus, the accumulative voltage variation is prevented, thereby supplying the stable write current Iw for the long term.

According to this exemplary embodiment, the effect similar to the first exemplary embodiment is obtained. That is, the long-term voltage variation is prevented, thereby insuring that the internal voltage from the voltage generating circuit 1 is stabilized for the long term. Thus, the reliability of the semiconductor integrated circuit is improved. Also, the operation speed of the semiconductor integrated circuit is improved. Moreover, according to this exemplary embodiment, it is possible to suppress the variation in the gate voltage Vp2 during the continuous write process period. It should be noted that this exemplary embodiment can be applied to the second exemplary embodiment and the third exemplary embodiment.

According to the present invention, since the stabilization switch 4 is added between the stabilization capacitance 3 and the voltage generating circuit 1, the long-term variation in the voltage can be removed in principle. Thus, the semiconductor integrated circuit is provided that can be stably operated at the high speed. It should be noted that the present invention is not limited to the above-mentioned exemplary embodiments. It may be suitably changed or modified by one skilled in the art, within the technical scope noted in claims.

The invention claimed is:

1. A semiconductor integrated circuit comprising:
   a voltage generating circuit configured to generate a reference voltage;
   a function circuit configured to operate by using the reference voltage;
   a first capacitance connected to a first node between said voltage generating circuit and said function circuit; and
   a switch provided between said voltage generating circuit and said first node,
   wherein said switch is turned off at a time simultaneous with a first time at which said function circuit is activated, or at a time previous to the first time by a predetermined time.

2. The semiconductor integrated circuit according to claim 1, wherein said switch is turned on at a time simultaneous with a second time at which said function circuit is deactivated, or at a time after the second time by a predetermined time.

3. The semiconductor integrated circuit according to claim 1, wherein said switch is in a turned-off state at least for a period during which said function circuit is in an activated state.

4. The semiconductor integrated circuit according to claim 1, further comprising:
   a second capacitance connected to a second node between said voltage generating circuit and said switch.

5. The semiconductor integrated circuit according to claim 1, wherein said voltage generating circuit generates a plurality of the reference voltages,
   said function circuit receives the plurality of reference voltages through a plurality of routes, and operates by using the plurality of reference voltages, and
   said first capacitance is connected to said first node in each of said plurality of routes.

6. The semiconductor integrated circuit according to claim 1, wherein said function circuit comprises a current source configured to generate a predetermined current based on the reference voltage.

7. The semiconductor integrated circuit according to claim 6, further comprising:
   a memory cell array; and a decoder provided between said memory cell array and said current source, wherein said decoder is activated in response to a decoder activation signal such that the predetermined current is supplied to said memory cell array, and said switch operates in synchronization with the decoder activation signal.

8. The semiconductor integrated circuit according to claim 7, further comprising:

a control signal generating circuit configured to generate the decoder activation signal to said decoder and said switch, wherein said switch is turned on or turned off in response to the decoder activation signal.

9. The semiconductor integrated circuit according to claim 8, wherein said control signal generating circuit outputs an activation signal to said function circuit to activate said current source, after the generation of the decoder activation signal to turn off said switch, and outputs a deactivation signal to deactivate said current source, before the output of the decoder activation signal to turn on said switch.

10. The semiconductor integrated circuit according to claim 6, further comprising:

a memory cell array; and a decoder provided between said memory cell array and said current source, wherein said decoder is activated in response to a decoder activation signal such that the predetermined current is supplied to said memory cell array, and said switch operates in synchronization with a signal other than the decoder activation signal.

11. A semiconductor integrated circuit comprising:

a memory element configured to store a data;

a voltage generating circuit configured to generate a reference voltage;

a current source configured to generate a predetermined current based on the reference voltage to supply to said memory element;

a first capacitance connected to a first node between said voltage generating circuit and said current source; and a switch provided between said voltage generating circuit and said first node, wherein said switch is turned off at a time simultaneous with a first time at which said function circuit is activated, or at a time previous to the first time by a predetermined time.

12. The semiconductor integrated circuit according to claim 11, wherein said memory element comprises a magnetic tunnel junction element.

13. The semiconductor integrated circuit according to claim 11, wherein said switch is turned on at a time simultaneous with a second time at which said function circuit is deactivated, or at a time after the second time by a predetermined time.

14. The semiconductor integrated circuit according to claim 11, wherein said switch is in a turned-off state at least for a period during which said function circuit is in an activated state.

15. The semiconductor integrated circuit according to claim 11, further comprising:

a second capacitance connected to a second node between said voltage generating circuit and said switch.

16. The semiconductor integrated circuit according to claim 11, wherein said voltage generating circuit generates a plurality the reference voltages, said function circuit receives the plurality of reference voltages through a plurality of routes, and operates by using the plurality of reference voltages, and said first capacitance is connected to said first node in each of said plurality of routes.

17. The semiconductor integrated circuit according to claim 11, further comprising:

a decoder provided between said memory element and said current source, wherein said decoder is activated in response to a decoder activation signal such that the predetermined current is supplied to the memory element, and said switch operates in synchronization with the decoder activation signal.

18. The semiconductor integrated circuit according to claim 17, further comprising:

a control signal generating circuit configured to generate the decoder activation signal to said decoder and said switch, wherein said switch is turned on or turned off in response to the decoder activation signal.

19. The semiconductor integrated circuit according to claim 18, wherein said control signal generating circuit outputs an activation signal to said function circuit to activate said current source, after the generation of the decoder activation signal to turn off said switch, and outputs a deactivation signal to deactivate said current source, before the output of the decoder activation signal to turn on said switch.

20. The semiconductor integrated circuit according to claim 11, further comprising:

a decoder provided between said memory cell array and said current source, wherein said decoder is activated in response to a decoder activation signal such that the predetermined current is supplied to the memory element, and said switch operates insynchronization with a signal other than the decoder activation signal.

\* \* \* \* \*